United States Patent [19]

Yamamoto

[11] Patent Number: 5,408,118
[45] Date of Patent: Apr. 18, 1995

[54] VERTICAL DOUBLE DIFFUSED MOSFET HAVING A LOW BREAKDOWN VOLTAGE AND CONSTITUTING A POWER SEMICONDUCTOR DEVICE

[75] Inventor: Masanori Yamamoto, Tokyo, Japan

[73] Assignee: NEC Corporation, Japan

[21] Appl. No.: 23,192

[22] Filed: Feb. 25, 1993

[30] Foreign Application Priority Data

Feb. 26, 1992 [JP] Japan .................................. 4-038918

[51] Int. Cl.[6] ...................... H01L 29/76; H01L 29/94
[52] U.S. Cl. .................................... 257/342; 257/339; 257/341
[58] Field of Search .............. 257/329, 335, 337, 339, 257/341, 342

[56] References Cited

U.S. PATENT DOCUMENTS

| | | | |
|---|---|---|---|
| 4,561,003 | 12/1985 | Tihanyi et al. | 257/341 |
| 5,008,725 | 4/1991 | Lidow et al. | 257/341 |
| 5,016,066 | 5/1991 | Takahashi | 257/341 |

FOREIGN PATENT DOCUMENTS

| | | | |
|---|---|---|---|
| 52-132684 | 11/1977 | Japan | 257/342 |
| 60-10677 | 1/1985 | Japan | 257/342 |
| 1-238173 | 9/1989 | Japan | 257/342 |

OTHER PUBLICATIONS

IEEE Transaction on Electron Devices, vol. ED-27, No. 2, Feb. 1980, "Modeling of the On-Resistance of LDMOS, VDMOS, and VMOS Power Power Transistors" by Sun et al., pp. 356–367.

Primary Examiner—Steven Ho Yin Loke
Attorney, Agent, or Firm—Laff, Whitesel, Conte & Saret, Ltd.

[57] ABSTRACT

A vertical double diffused MOSFET includes a gate electrode formed with a plurality of first open windows and at least one second open window connecting two of the first open windows. The first open windows are of a desired polygonal shape and have centers at lattice points of a square lattice provided in a first direction and a second direction orthogonal to the first direction with predetermined interval. The second open window takes in the form of slit having a predetermined width and arranged on a line connecting the center of one first open window to the center of at least one of four other first open windows obliquely adjacent to the one first open window. With the provision of the second open window, the channel width per unit area becomes wider than for a gate electrode having only the first open windows, resulting in a reduced on-resistance.

7 Claims, 16 Drawing Sheets

VERTICAL DOUBLE DIFFUSED MOSFET HAVING A LOW BREAKDOWN VOLTAGE AND CONSTITUTING A POWER SEMICONDUCTOR DEVICE

BACKGROUND OF THE INVENTION

1. Field of the Invention

The present invention relates to a vertical double diffused MOSFET (referred to at VDMOSFET hereinafter) constituting a power semiconductor device and, particularly, to a low breakdown voltage VDMOSFET.

2. Description of the Prior Art

Instead of bipolar transistor, a MOSFET has been used as an element constituting a power semiconductor device in view of a merit of higher switching speed. Among DSAMOSFET known as such MOSFET, the VDMOSFET has been used mainly in view of easiness of fabrication.

Such conventional VDMOSFET is usually manufactured as follow: An N⁻ type epitaxial layer having a predetermined thickness is formed on one surface of an N⁺ type silicon substrate and, on the N⁻ type epitaxial layer, a gate oxide film having a predetermined thickness and a gate electrode comprising an N⁺ type polycrystalline silicon film having a predetermined thickness are formed. The gate electrode (and the gate oxide film) is formed with a plurality of predetermined polygonal open windows at regularly arranged positions. On a surface of the N⁻ type epitaxial layer exposed in each open window, a P⁺ type base region self-aligned with the open window, that is, with an edge portion of the gate electrode, and an N⁺ type source region having one end self-aligned with the edge portion of the gate electrode are formed. That is, one VDMOSFET is provided in each open window. Although the VDMOSFETs have associated P⁺ type base regions and N⁺ type source regions, respectively, their gate electrodes are common. The P⁺ type base region of each VDTMOSFET is exposed in a central portion of the open window. That is, the N⁺ type source region formed on the P⁺ type base region is provided not on the whole area of the open window but on an inner peripheral portion of the open window with an outer edge thereof being self-aligned with the edge of the open window and an inner edge thereof being at a predetermined distance measured from the edge portion of the open window.

An inter-layer insulating film covering the gate electrode including the open windows is provided in which contact-holes deep enough to reach the P⁺ type base regions and N⁺ type source regions in the windows are formed, respectively. On the inter-layer insulating films, a source electrode is formed so that is connects the P⁺ type base regions and N⁺ type source regions of all of the VDMOSFETs through the contact holes. N type drain regions of these VDMOSFETs are common and formed by the N⁻ type epitaxial layer and the N⁺ type silicon substrate. A drain electrode is formed on the other surface of the N⁺ type silicon substrate. Thus, the power semiconductor device constituted as mentioned above includes VDMOSFETs connected in parallel, the number thereof corresponding to that of the open windows.

Junction depth of the P⁺ type base region is $X_{jb}$ in vertical direction and that of a portion thereof extending from the edge portion of the gate electrode to a portion immediately below the gate electrode is $X_{jb,l}$ (which is nearly equal to 0.8 $X_{jb}$) in horizontal direction. Vertical junction depth of the N⁺ type source region is $X_{js}$ ($<X_{jb}$) and that of a portion extending from the edge portion of the gate electrode to a portion thereof immediately below the gate electrode is $X_{js,l}$ (which is nearly equal to 0.8 $X_{js}$) in horizontal direction. A portion of the P⁺ type base region which is directly in contact with the gate oxide film immediately below the gate electrode is a channel region of the associated VDMOSFET. Channel length is substantially equal to ($X_{jb,l}-X_{js,l}$). When a minimum distance between two adjacent opening windows is equal to a gate electrode length $L_G$ and $L_G > 2 X_{jb,l}$, a plurality of VDMOSFETs are formed below a gate electrode.

The opening window may be regular square or regular hexagonal. For square opening windows having desired side length, their centers are arranged at intersections of a two dimensional lattice having a desired lattice interval as disclosed in, for example, Japanese Patent Application Laid-open No. Sho 52-132684 (publication date: Nov. 7, 1977). Four sides of each square opening window are parallel to the square lattice. As a modification of the square opening window, an octagonal window is disclosed in U.S. Pat. No. 5,016,066, (issued on May 14, 1991 and assigned to the assignee of this application). A right hexagonal window is disclosed in, for example, U.S. Pat. No. 5,008,725 (issued on Apr. 16, 1991). One of objects of the right hexagonal window is to arrange the windows in a close-packed state. Since both U.S. Pat. Nos. 5,016,066 and 5,008,725 relate to VDMOSFET's having high BVdss which is breakdown voltage between a drain and source regions when the source region and a base region are short-circuited, impurity density distribution in the drain region immediately below a gate electrode is considered.

On-resistance is one of important characteristics of a VDMOSFET. If on-resistance is low, a switching speed and current density of a power semiconductor device become high, respectively. As disclosed in IEEE Transactions of Electron Devices, Vol. ED-27, No. 2, pp. 356–367, 1980, on-resistance $R_{ON}$ in a VDMOSFET is represented by $$R_{ON}=R_E+R_D+R_{JFET}+R_{SUB}$$

where contact resistance between a source region and a source electrode, etc., are neglected and where $R_E$ is on-resistance in a channel region of the VDMOSFET (in enhanced mode), $R_D$ is on-resistance in an accumulation layer (depletion mode from the view of MOSFET) of a drain region (epitaxial layer) immediately below a gate electrode, $R_{JFET}$ is on-resistance in a JFET region and $R_{SUB}$ is on-resistance of the epitaxial layer and a silicon substrate excluding the JFET region.

In a VDMOSFET having high breakdown voltage, it is necessary, in order to obtain high $BV_{DSS}$, to make the epitaxial film thick, to make impurity density of the epitaxial layer low and to make $X_{jb}$ of a base region large. Therefore, $R_{ON}$ of the high breakdown voltage VDMOSFET mainly depends on $R_D+R_{JFET}+R_{SUB}$ rather than $R_E$.

On the other hand, for a low breakdown voltage VDMOSFET, it is possible to reduce thickness of an epitaxial layer, impurity density thereof and $X_{jb}$ of a base region. Therefore, $R_{ON}$ of such VDMOSFET depends largely on $R_E$. In order to reduce $R_{ON}$, it is enough to make a channel length short and a channel width large since R is proportional to (channel length)/(channel width). The channel length is restricted by the punch-through characteristics. Therefore, in order to further reduce $R_{ON}$ of a VDMOSFET, the channel width should be made as large as possible. In view of the power semiconductor device, it is important to reduce on-resistance (normalized-$R_{ON}$) per unit area of the power semiconductor device. Assuming an area to be occupied by a single low breakdown voltage VDMOSFET, that is, a cell size, as $A_C$, the number of VDMOSFETs per unit area is $1/A_C$. That is, $1/A_C$ VDMOSFETs are connected in parallel within the unit area. Therefore, normalized-$R_{ON}=A_C \cdot R_{ON}$ must be small. In other words, the channel width per unit area must be made large.

To make a channel width per unit area large when polygonal opening windows having conventional construction and regularly arranged on a gate electrode are provided, with channel length of each VDMOSFET and $X_{jb}$ of a base region thereof, etc., being constant, is to provide right hexagonal opening windows such as shown in U.S. Pat. No. 5,016,066 on the gate electrode, in which case, on-resistance ($A_C \cdot R_{ON}$) per unit area becomes minimum. That is, in the conventional VDMOSFET, it is impossible to further reduce $A_C \cdot R_{ON}$. Therefore, when a power semiconductor device is constituted with conventional low breakdown voltage VDMOSFETs, it is difficult to further improve switching speed and current density of the power semiconductor device.

BRIEF DESCRIPTION OF THE INVENTION

Object of the Invention

An object of the present invention is to provide a VDMOSFET constituting a power semiconductor device.

Another object of the present invention is to provide a VDMOSFET having low breakdown voltage ($BV_{DSS}$) and constituting a power semiconductor device.

Another object of the present invention is to provide a VDMOSFET having low breakdown voltage ($BV_{DSS}$) and constituting a power semiconductor device, whose on-resistance is low.

A further object of the present invention is to provide a VDMOSFET having low breakdown voltage ($BV_{DSS}$) and constituting a power semiconductor device, whose normalized on-resistance (normalized-$R_{ON}$) per unit area is low.

Summary of the Invention

A VDMOSFET according to the present invention comprises a silicon substrate of one conductivity type, an epitaxial layer on the one conductivity type formed on a surface of the silicon substrate and having a predetermined thickness, impurity density thereof being lower than that of the silicon substrate, a gate oxide film formed in a surface of the epitaxial layer, a gate electrode formed on the gate oxide film, the gate electrode including a plurality of first opening windows having a desired polygonal shape and having centers arranged at intersections of a right square lattice arranged with a desired interval in a first direction and with a desired interval in a second direction perpendicular to the first direction and a plurality of second opening windows each being in the form of a slit having a desired width and provided along a line connecting the center of at least one of the first opening window to the center of at least one of four of the first opening windows obliquely adjacent to the at least one first opening windows, a first insulating film formed on an upper surface of the gate electrode, a second insulating film formed on side surfaces of the gate electrode, a base region of the other conductivity type formed on the surface of the epitaxial layer in self-aligned manner with the first and second opening windows and having a predetermined junction depth, a source region of the one conductivity type having a predetermined junction depth and formed on a surface of the base region with one end being self-aligned with the first and second opening windows and the other end being space from the first opening window by a desired distance, a source electrode covering the first and second opening windows and being short-circuited with the base region in at least the first opening windows to connect directly to the source region and a drain electrode formed on the other surface of the silicon substrate.

Preferably, the polygonal first opening window has two sides parallel to the first direction and two sides parallel to the second direction. Preferably, the first opening window is square or octagonal. Preferably, at least one of the first opening window is connected to two of the first opening windows which are obliquely adjacent thereto by two of the second opening windows. Preferably, the source electrode is directly connected to the source region within each of the second opening windows. Preferably, the VDMOSFET includes a base deriving electrode of a polysilicon film of the other conductivity type connected directly to the base region through a direct-contact hole provided in the vicinity of the center portion of the first opening window and the second insulating film is formed on side surfaces of the base deriving electrode so that the source electrode is directly connected to an upper surface of the base deriving electrode.

For example, when the gate electrode of the VDMOSFET includes only square first opening windows, the junction depth ($X_{jb}$) of the base region of the other conductivity type is determined from film thickness of the epitaxial layer of the one conductivity type, impurity density and required breakdown voltage. In case of a low breakdown voltage VDMOSFET, a horizontal depth ($X_{jb,l}$) of a junction extending immediately below the gate electrode is also determined therefrom. By setting a channel length (and the junction depth ($X_{js}$) of the source region) of the VDMOSFET constant, a gate electrode length ($L_G$) and a length ($L_W$) of the side of the first opening window with which on-resistance (normalized-$R_{ON}=A_C \cdot R_{ON}$) per unit area is minimized (that is, channel width per unit area is maximized) are obtained. When the value of $L_G$ is determined, an optimum value ($L_G - 2X_{jb,l}$) of a gap between base regions of two VDMOSFETs which are adjacent in the first or second direction immediately below the gate electrode is determined. In such case, the distance between the base regions of these two VDMOSFETs is increased by $(2^{0.5} - 1) \times L_G - 2 X_{jb,l}$ between the obliquely adjacent two first opening windows.

In the present invention, the second opening window in the form of a slit having a desired width is formed between the obliquely adjacent two first opening windows in which the base region is widened is formed and channel regions are formed on both sides of the second opening window to effectively increase the channel width to thereby reduce the normalized-$R_{ON}(A_C \cdot R_{ON})$. As a result, according to the present invention, the normalized-$R_{ON}$ ($A_C \cdot R_{ON}$) becomes smaller than in a case where, for example, hexagonal opening windows are close-packed.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE PREFERRED EMBODIMENTS

Before describing the present invention, a conventional VDMOSFET which is disclosed in, for example, in the previously mentioned Japanese Patent Application Laid-open No. Sho 52-132684 will be described first, with reference to the drawings, and the process leading to the present invention will be described thereafter by using graphs showing results of experiments which were conducted by the present inventors.

Figure 1A:
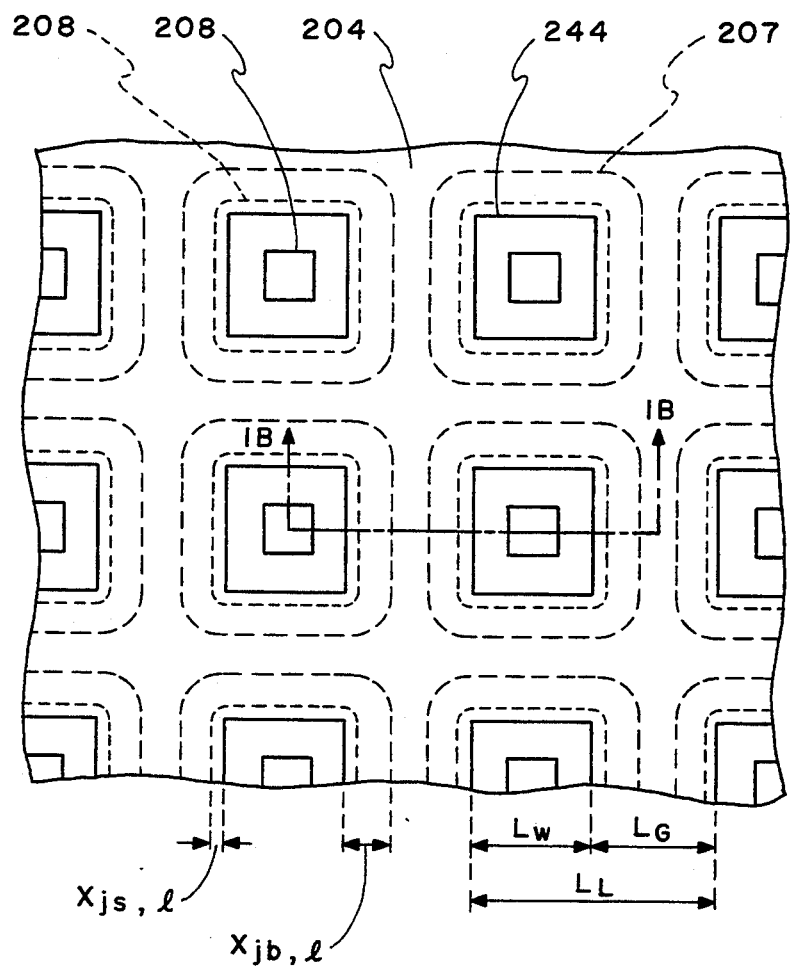
FIG. 1A is a schematic plan view of gate electrodes and others of a conventional VDMOSFET structure.
Figure 1B:
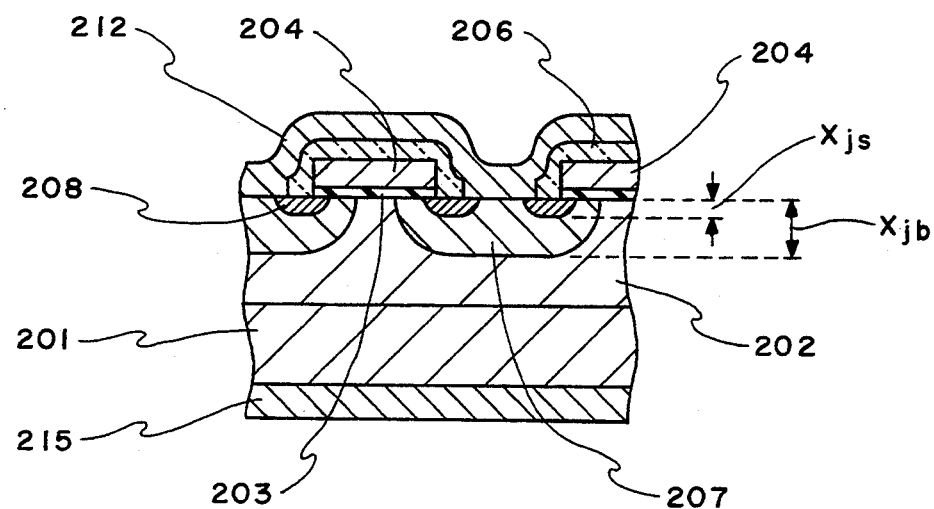
FIG. 1B is a cross section taken along a line AA in FIG. 1A.

First, FIG. 1A which is a schematic plan view of the conventional VDMOSFET with layers above a gate electrode being removed for simplicity of illustration and a P+ type base region being shown as having a simplified shape since the present invention relates to a low breakdown voltage VDMOSFET and FIG. 1B which is a cross section taken along a line AA in FIG. 1A are referred to.

As shown in FIGS. 1A and 1B, an N⁻ type epitaxial layer 202 having a predetermined thickness is formed on a surface of an N+ type silicon substrate 201 and, on the N⁻ type epitaxial layer 202, a gate oxide film 203 having a predetermined thickness and a gate electrode 204 which is formed from an N+ type polycrystalline silicon film having a predetermined thickness and has a gate electrode length $L_G$ are formed. The gate electrode 204 is formed with a plurality of square open windows 244. Side length of each open window 244 is $L_W$ and the open windows are arranged at positions along a first direction and a second direction perpendicular to the first direction, that is, in FIG. 1A, in a horizontal direction and a vertical direction, with interval $L_G$ in both directions. That is, these open windows 244 are arranged with centers thereof being positioned at lattice points of a two dimensional square lattice having lattice interval, that is, lattice constant $L_L=L_G+L_W$, in both the first and second directions. One side pair of each open window 244 is in parallel to the first direction and the other side pair is in parallel to the second direction. One VDMOSFET is formed in each open window 244. An area occupied by each VDMOSFET, that is, the cell size, is $L_L^2$.

A P+ type base region 207 of each VDMOSFET is formed on the surface of the N⁻ type epitaxial layer 202 in a self-aligned manner with the open window 244. Junction depth of the P+ type base region 207 is $X_{jb}$ in vertical direction and that of a portion thereof existing immediately below the gate electrode 204 is $X_{jb,l}$ (which is nearly equal to 0.8 $X_{jb}$) in horizontal direction. In this case, $2X_{jb,l} < L_G$. An N+ type source region 208 of the VDMOSFET is formed on a surface of each P+ type base region 207 with an outer edge thereof being self-aligned with an edge of the pen window 244 and an inner edge being spaced from the edge of the open window 244 by a predetermined distance. The P+ type base region 207 is exposed in the vicinity of the center of the open window 244. Junction depth of the N+ type source region 208 is $X_{js}$ ($<X_{jb}$) in vertical direction and that of a portion thereof existing immediately below the gate electrode 204 is $X_{js,l}$ (which is nearly equal to 0.8 $X_{js}$) in horizontal direction.

An inter-layer insulating film 206 covering the gate electrodes 204 and the open windows 244 is provided in which contact-holes deep enough to reach a bottom of the open windows 244 are formed, respectively. Through the contact hole, an exposed surface of the P type base region 207 and a portion of the exposed surface of the N+ type source region 208 in the open window 244 are exposed. A source electrode 212 made from a metal film is formed on the inter-layer insulating film 206 so that it is connected directly to the N+ type source region 208 and the P+ type base region 207 through the contact hole. A metal drain electrode 215 is formed on the other surface of the N+ type silicon substrate 201. An N type drain region of the VDMOSFET is composed of the N+ type silicon substrate 201 and the N− type epitaxial layer 202.

Figure 2A:
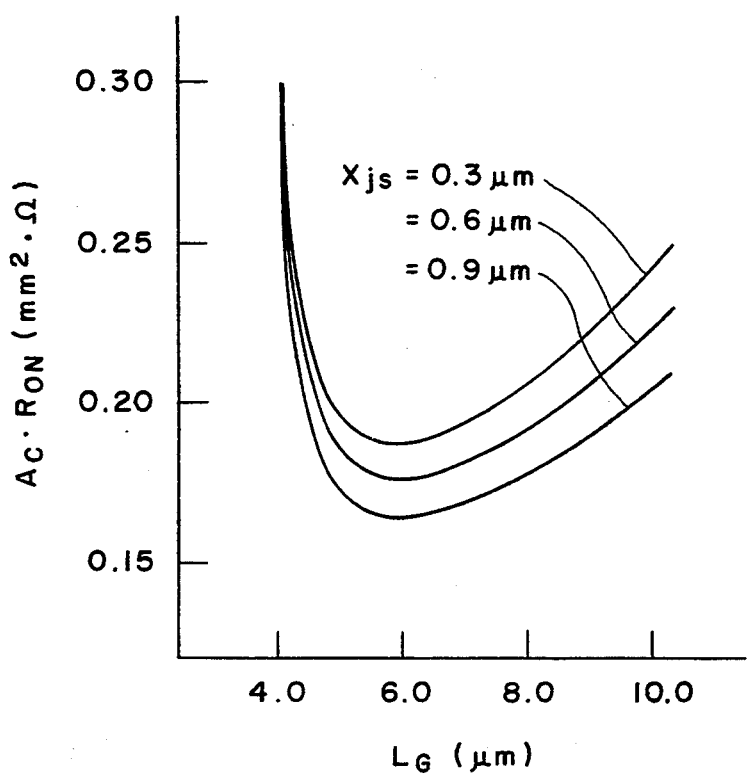
FIGS. 2A and 2B are graphs showing a variation of on-resistance (normalized-$R_{ON}=A_C \cdot R_{ON}$) per unit area with respect to a gate electrode length ($L_G$) in the conventional VDMOSFET structure.
Figure 2B:
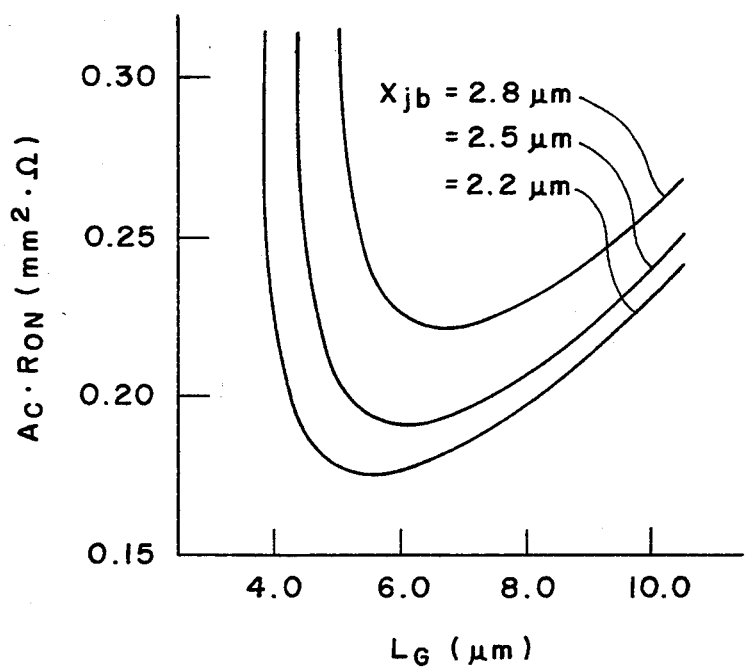

The present inventors had conducted experiments in order to obtain design parameters for minimizing normalized-$R_{ON}$ ($=A_C \cdot R_{ON}$) when the structure shown in FIGS. 1A and 1B is applied to a low breakdown voltage VDMOSFET using power source voltage of 5 V, that is, having $BV_{DSS}$ of about 30 V. In those experiments, specific resistance and thickness of an N+ type silicon substrate were 10 mΩ·cm and 450 μm, respectively, specific resistance and thickness of an N− type epitaxial layer were 0.4 Ω·cm and 6.5 μm, respectively, thickness of a gate oxide film was 50 nm and threshold voltage was 1.5 V. $A_C \cdot R_{ON}$ was measured at gate voltage $V_{GS}=4$ V. Length of one side of an open window was fixed to $L_W=7.0$ μm. From FIGS. 2A and 2B which are graphs showing dependency of $A_C \cdot R_{ON}$ on the gate electrode length $L_G$ with $X_{js}$ and $X_{jb}$ as parameters, the following matters are clear. Here, in FIG. 2A $X_{jb}$ is designed to have a value of 2.5 μm, whereas in FIG. 2B $X_{js}$ is designed to have a value of 0.6 μm.

First, when $X_{jb}$ is constant, the value of $L_G$ with which $A_C \cdot R_{ON}$ becomes minimum has no dependency on the channel length ($=X_{jb,l}-X_{js,l}$). When $X_{jb}=2.5$ μm, $A_C \cdot R_{ON}$ increases with decrease of $L_G$ from 6.0 μm. This is because $R_{ON}$ of a VDMOSFET is influenced largely by ($R_D+R_{JFET}$). With $L_G=4.0$ μm, $A_C \cdot R_{ON}$ increases sharply. This is because the P+ type base regions of adjacent two VDMOSFETs are substantially connected to each other. Second, $L_G$ with which $A_C \cdot R_{ON}$ is made minimum satisfies $L_G \approx 3 X_{jb,l}$. From these results, it is clear that, when $X_{jb}=2.5$ μm and $X_{js}=0.6$ μm, the channel width per unit area becomes maximum (about 191 mm/mm²) and $A_C \cdot R_{ON}$ becomes minimum if $L_G=6.0$ μm and $L_W=4.0$ μm. In such case, $A_C \cdot R_{ON}$ measured was about 0.171 mm²Ω. This value will be referred to as minimum value of $A_C \cdot R_{ON}$ in a square open window, hereinafter. According to experiments conducted for a case where a gate electrode has right hexagonal open windows under the same conditions as those in the above mentioned experiments, it was found that the channel width becomes maximum (about 196 mm/mm²) and $A_C \cdot R_{ON}$ becomes minimum (about 0.167 mm²Ω which will be referred to as minimum value of $A_C \cdot R_{ON}$ of the conventional structure, hereinafter) when a distance between parallel sides of the open window was 4.0 μm and gate electrode length was 6.0 μm.

Now, the present invention will be described with reference to the drawings.

Figure 3A:
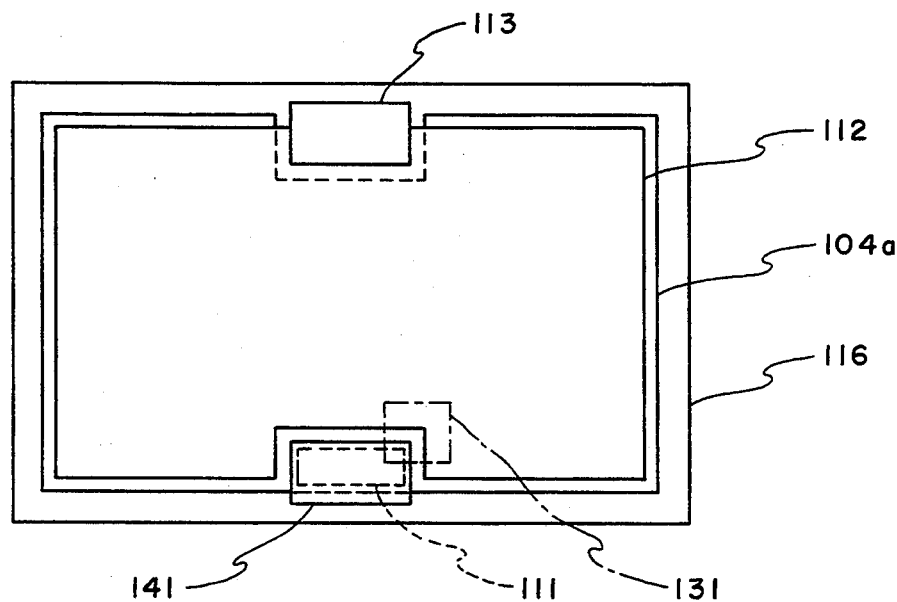
FIG. 3A is a schematic plan view of a power semiconductor device chip constituted with VDMOSFETs according to a first embodiment of the present invention.
Figure 3B:
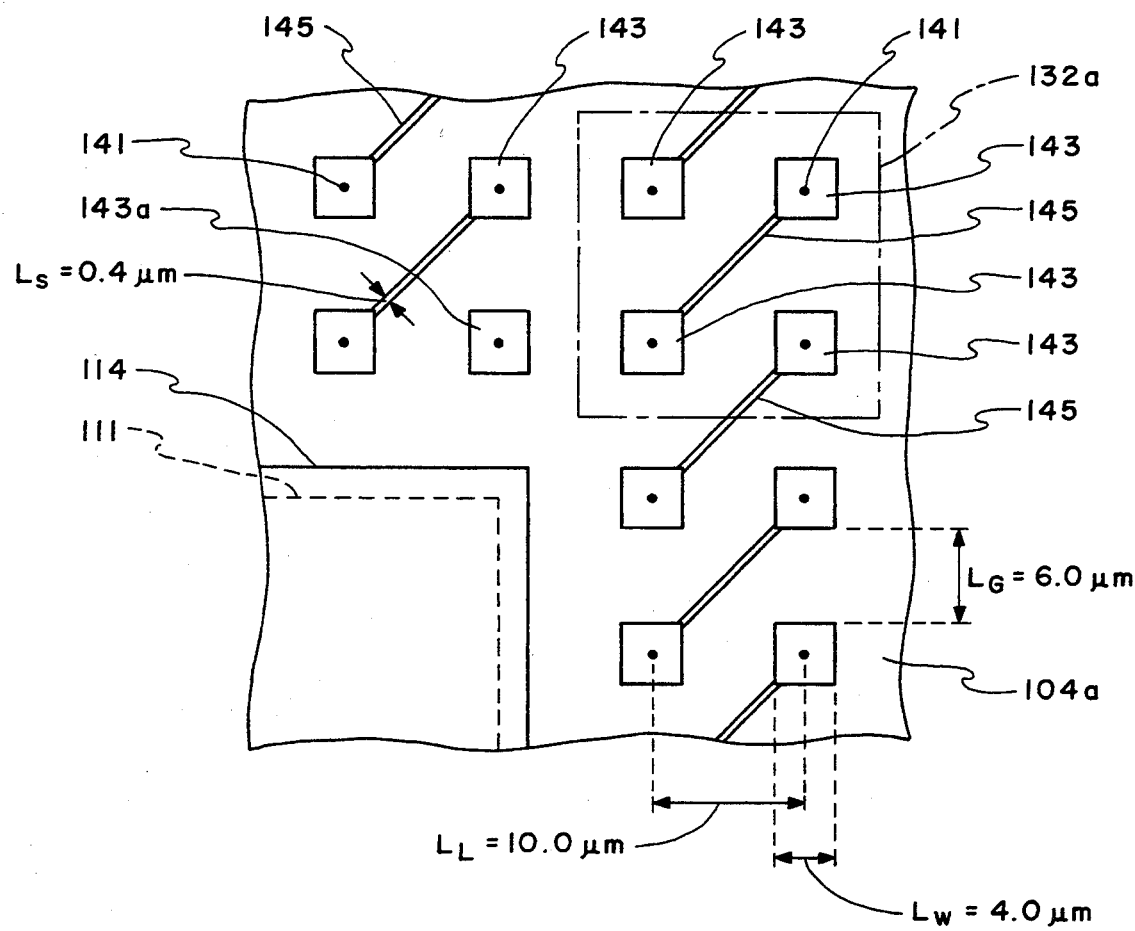
FIG. 3B is an enlarged plan view of a region 131 shown in FIG. 3A, showing conceptually a gate electrode of the VDMOSFET according to the first embodiment.

Referring to FIG. 3A which is a schematic plan view of a power semiconductor device chip constituted with VDMOSFETs according to a first embodiment of the present invention and FIG. 3B which is an enlarged plan view of a region 131 shown in FIG. 3A, showing conceptually a gate electrode of the VDMOSFET according to the first embodiment, on a surface of a power semiconductor device in the form of a chip, constituted with VDMOSFETs according to the first embodiment of the present invention, a gate electrode 104a is formed on the chip to cover the latter entirely and a source electrode 112 is formed on the gate electrode 104a. The gate electrode 104a is connected to a gate bonding pad 141 provided on a peripheral portion of the chip 116 through a contact hole 111. A source bonding pad 113 is provided on a portion of the source electrode 112 arranged in the peripheral portion of the chip 116.

Square first open windows 143 and 143a each having side length $L_W=4.0$ μm and second open windows 145 in the form of slits each having width $L_S=0.4$ μm which is equal to the minimum machinable size are formed in the gate electrode 104a. Centers of the first open windows 143 and 143a are positioned at lattice points 141 of a two dimensional square lattice whose lattice constant $L_L$ is 10.0 μm, respectively. A distance between adjacent two open windows 143 (143a) corresponds to the gate electrode length $L_G$ which is 6.0 μm. Further, $L_L=L_G+L_W$. The second open window 145 is formed to connect between two first open windows 143 adjacent obliquely to each other. The first open windows 143a in the vicinity of gate bonding pad 114 in the peripheral portion of the chip 116 can not be connected to obliquely adjacent first open windows 143 by the second open window 145. It should be noted that, although, in FIG. 3B, the second open windows 145 are oriented as shown, this orientation is not critical.

Figure 4A:
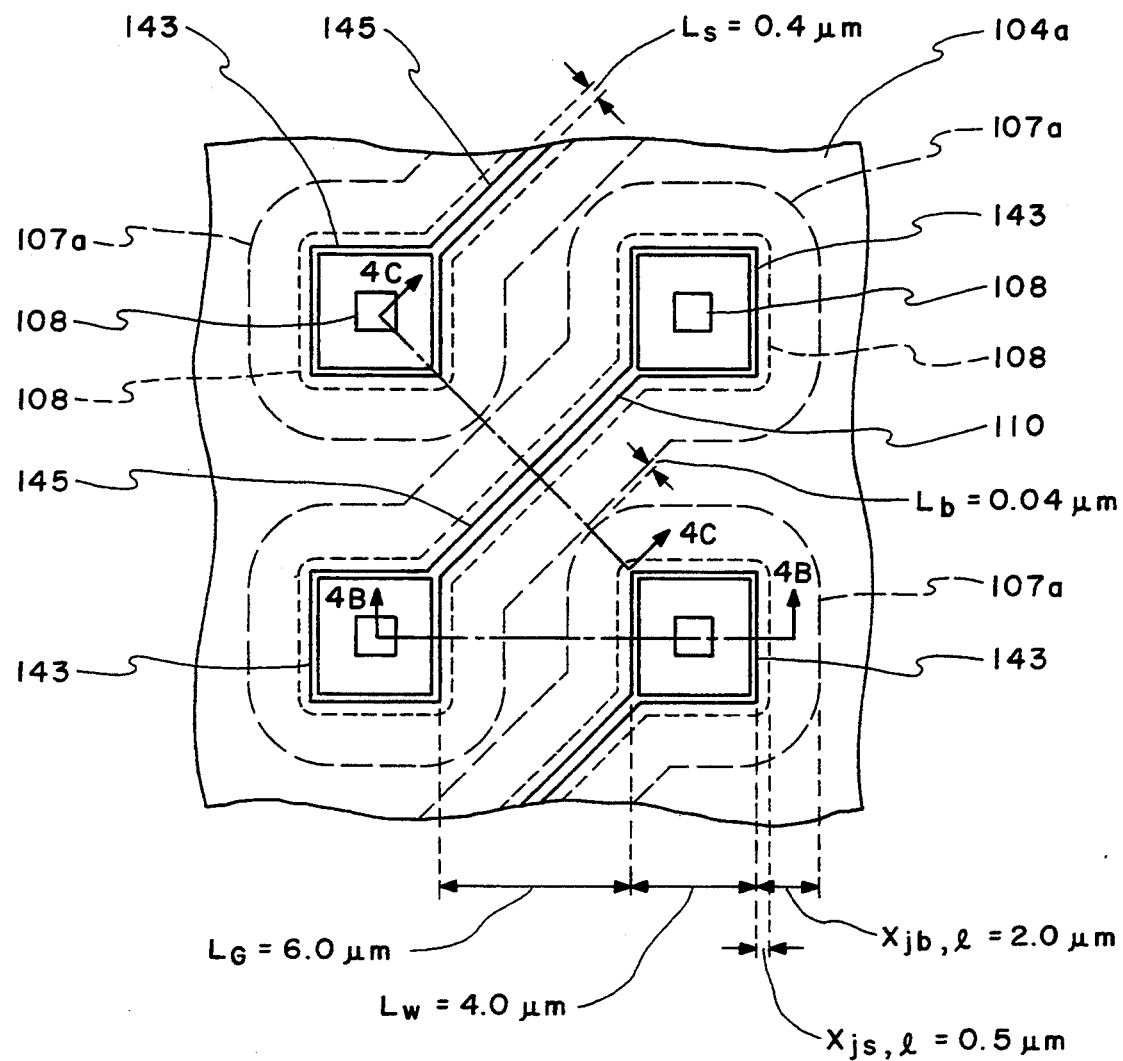
FIG. 4A is an enlarged plan view of a region 132a shown in FIG. 3B, schematically showing structure below the gate electrode of the VDMOSFET according to the first embodiment.
Figure 4B:
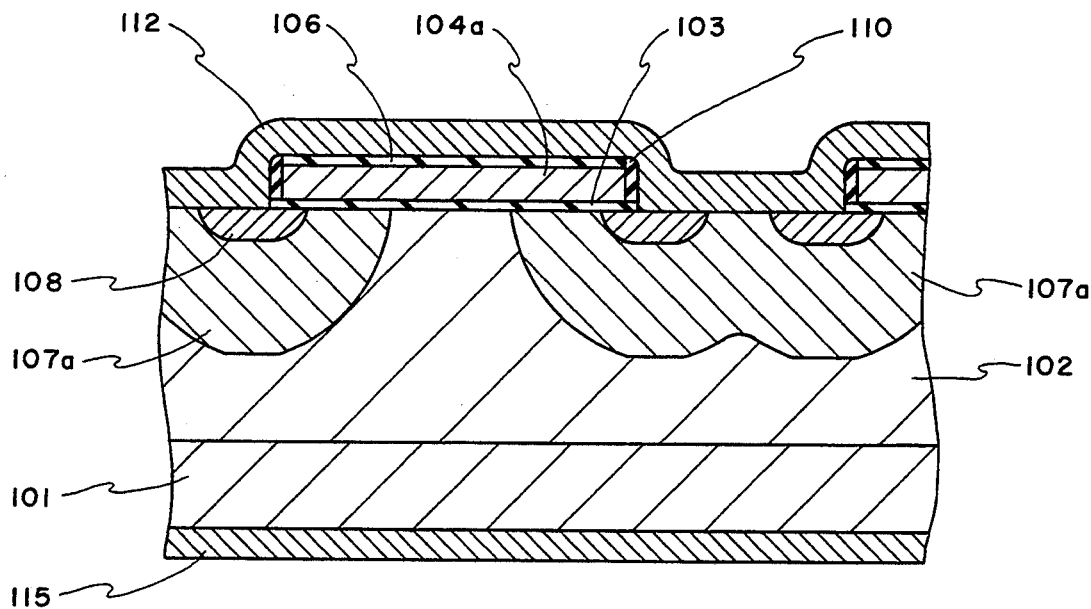
FIGS. 4B and 4C are enlarged cross sections taken along lines AA and BB in FIG. 4A.
Figure 4C:
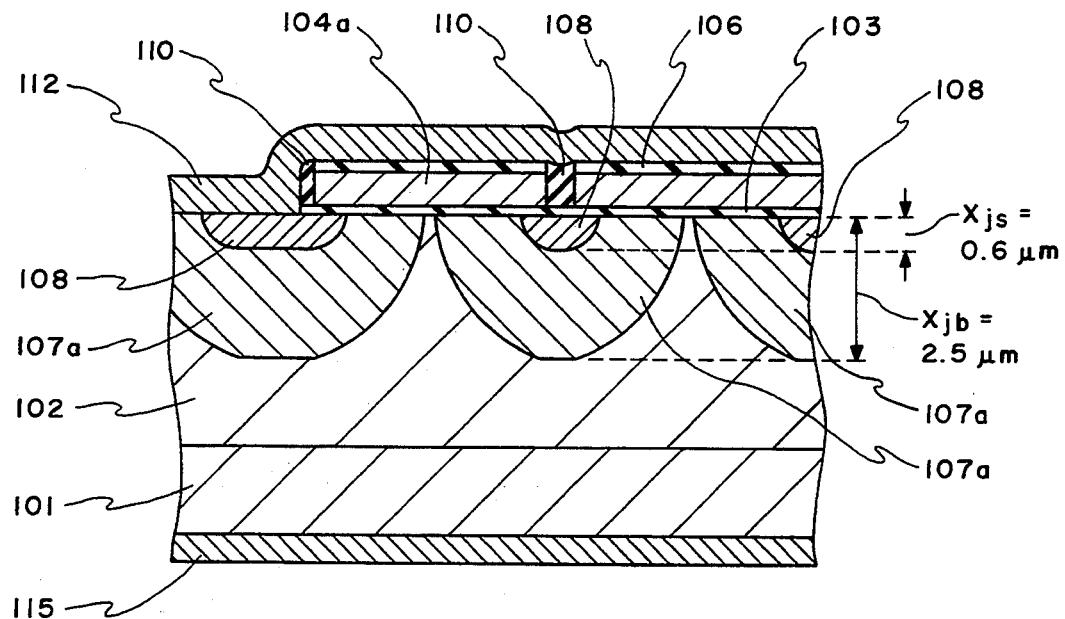

Referring to FIG. 4A which is an enlarged plan view of a region 132a shown in FIG. 3B, schematically showing structure below the gate electrode of the VDMOSFET according to the first embodiment and FIGS. 4B and 4C which are enlarged cross sections taken along lines AA and BB in FIG. 4A, the VDMOSFET according to the first embodiment is structured as described below.

An N− type epitaxial layer 102 having thickness of about 6.5 μm and specific resistance of about 0.4 Ω·cm is formed on a surface of an N+ type silicon substrate 101 having thickness of about 450 μm and specific resistance of about 10 mΩ·cm and, on the N− type epitaxial layer 102, a gate electrode 104a composed of a gate oxide film 103 having thickness of about 50 nm and an N+ type polysilicon film about 400 nm thick is formed. The gate electrode 104a is formed with first open windows 143 (and 143a) and second open windows 145 as mentioned previously. A silicon oxide film 106 having thickness of about 200 nm is formed on an upper surface of the gate electrode 104a as a first insulating film. Further, on side surfaces of the gate electrode 104a (edge portions of the open windows 143, 143a and 145), a spacer 110 of silicon oxide film having thickness of about 200 nm is formed as a second insulating film. Since the width Ls of the second open window 145 in the form of slit is small ($L_S=0.4$ μm), the second open window is buried by the spacer 110.

Each P type base region 107a is formed on the surface of the N− type epitaxial layer 102 in a self-aligned manner with one of the second open windows 145 and two of the first open windows 143 which are connected by the second open window 145. Junction depth of the P+ type base region 107a is $X_{jb}=2.5$ μm in vertical direction and that of a portion thereof existing immediately below the gate electrode 104a is $X_{jb,l}=2.0$ μm in horizontal direction. Minimum distance between adjacent two P+ type base regions 107a is about 0.04 μm. A portion in which the distance between the adjacent P+ type base regions 107a becomes minimum exists between a portion of the P+ type base region 107a which is self-aligned with one of the first open windows 143 and a portion of the P+ type base region 107a which is self-aligned with the second open window 145 which is not connected to the first open window 143 but closest thereto.

An N+ type source region 108 of the VDMOSFET is formed on a surface of the P+ type base region 107a with one edge thereof being self-aligned with the second open window 145 and two of the first open windows 143 which are connected by the second open window 145 and the edge being spaced from edges of the two first open windows 143 by a predetermined distance (for example, 1.5 μm), respectively. A predetermined portion (for example, 1 μm²) of the surface area of the P+ type base region 107a is exposed in the vicinity of the center of the first open window 143 (and 143a). Vertical junction depth of the N+ the source region 108 is $X_{js}=0.6$ μm and horizontal junction depth of a portion thereof existing immediately below the gate electrode 104a is $X_{js,l} \approx 0.5$ μm. A source electrode 112 composed of, for example, an Al-Si-Cl alloy film is formed covering the silicon oxide film 106 and the spacer 110. The source electrode 112 is connected directly to the N+ type source region 108 and the P+ type base region 107a through the first open window 143 (and 143a) as a contact hole. A metal drain electrode (115) is formed on the other surface of the N+ type silicon substrate 101.

In the first embodiment mentioned above, $A_C \cdot R_{ON}$ which is nearly equal to 0.147 mm²·Ω. That is, it is smaller than the minimum value of $A_C \cdot R_{ON}$ (about 0.171 mm²·Ω) for square open window and even smaller than the minimum value of $A_C \cdot R_{ON}$ (about 0.167 mm²·Ω) for the conventional structure. Therefore, the power semiconductor device constituted with the VDMOSFETs according to this embodiment is improved in switching speed and current density over the conventional device. The reduction of $A_C \cdot R_{ON}$ in this embodiment is due to the provision of the second open windows 145 in the gate electrode 104a in addition to the first open windows 143. Although, in this embodiment, $L_W=4.0$ μm for comparison purpose, the value of $L_W$ is not limited thereto.

Referring to FIGS. 5A to 5D which are schematic cross sections of the first embodiment taken along the line AA in FIG. 4A, showing manufacturing steps of a VDMOSFET, the latter is manufactured as described below. The manufacturing method used is the 0.4 μm process in which minimum machining size is 0.4 μm and preciseness of alignment is ±0.05 μm.

Figure 5A:
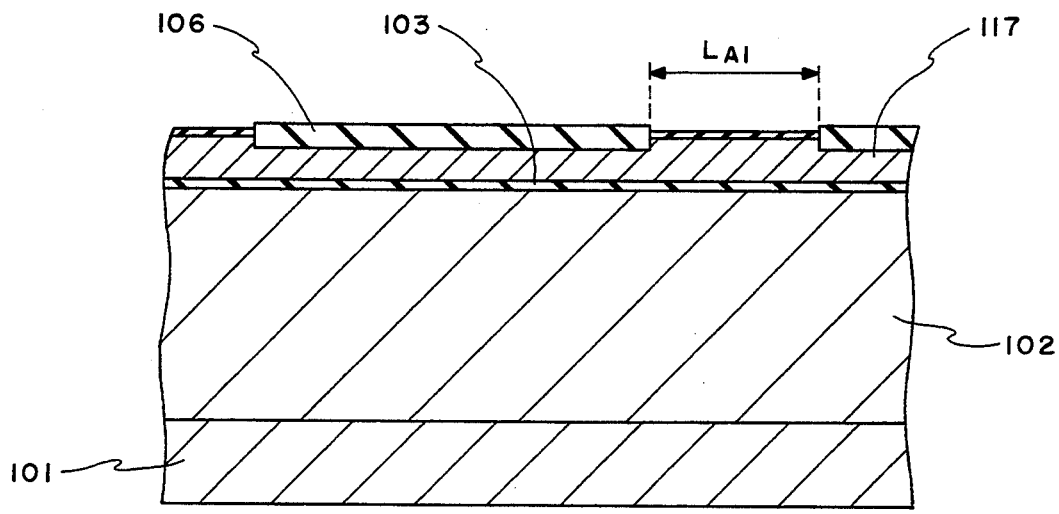
FIGS. 5A to 5D shown schematic cross sections of the first embodiment taken along the line AA in FIG. 4A, showing manufacturing steps thereof.

First, the N− type epitaxial layer 102 is formed on the surface of the N+ type silicon substrate 101. The gate oxide film 103 is formed on the N− type epitaxial layer 102 by thermal oxidation. On the gate oxide film 103, an N+ type polysilicon film 117 is formed by CVD or diffusion. A silicon nitride film 105 having a predetermined thickness is formed on the N+ type polysilicon film 117 by CVD. The silicon nitride film 105 is removed except portions thereof in which first and second open windows are to be formed. For example, in a region in which a first open window is to be formed, the silicon nitride film having width of $L_{A1}=L_W=4.0$ μm is left. A silicon oxide film 106 having thickness of about 400 nm is formed on portions of the surface of the N+ type polysilicon film 117 from which the silicon nitride film 105 was removed, by preferential oxidation, as shown in FIG. 5A. Thickness of the N+ type polysilicon film 117 immediately below the silicon oxide film 106 becomes about 400 nm.

Figure 5B:
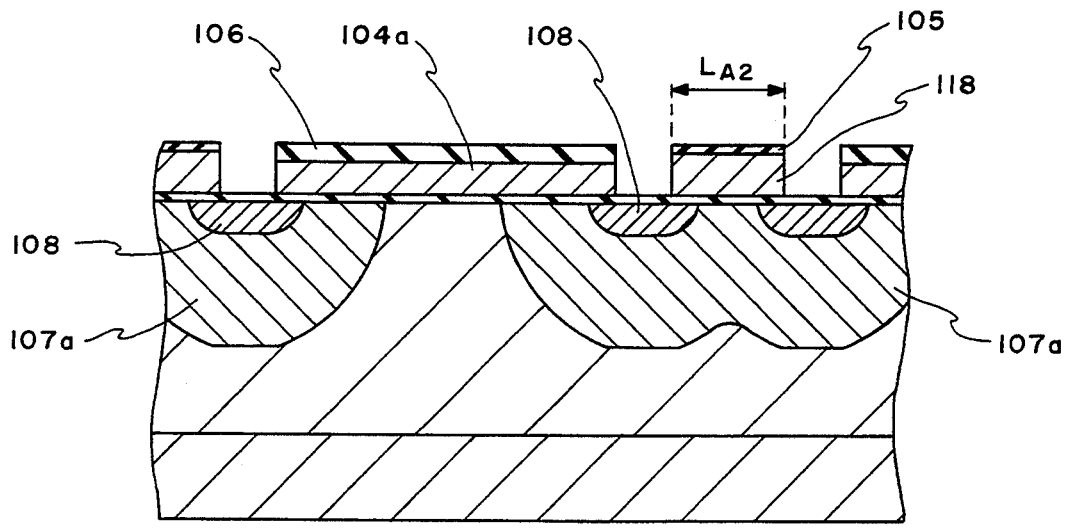
Figure 5C:
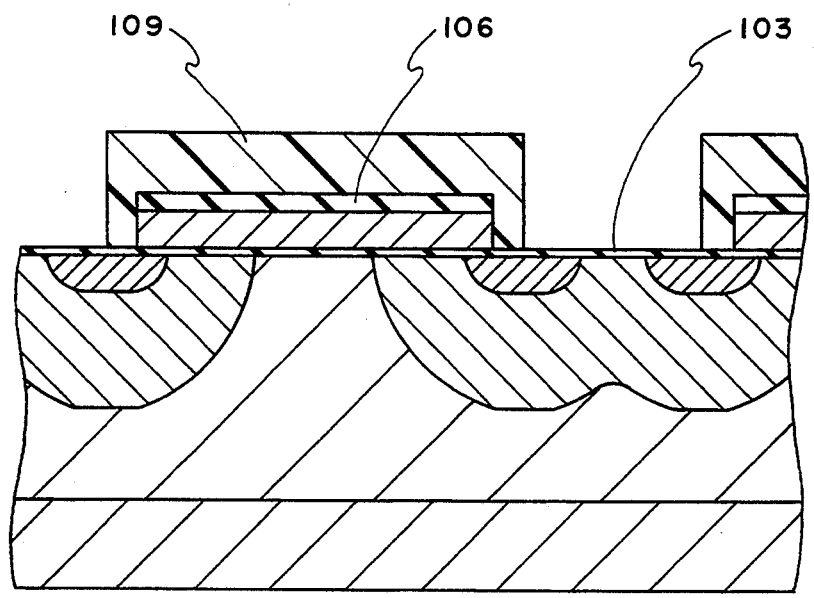

Then, a photo-resist film (not shown) is formed on the wafer. The photo-resist film has openings in regions thereof corresponding to areas of the wafer in which the second open windows are to be formed and regions corresponding to peripheral portions of areas in which the first open windows are to be formed. Width of the peripheral portion is $(L_{A1}+L_{A2})/2$ measured from an edge of each first open window. The silicon nitride film 105 and the N+ type polysilicon film 117 are removed by dry-etching using the photo-resist film as a mask. Thus, the gate electrode 104a, the N+ type polysilicon film 118 which is used as a mask for ion injection and which has a square shape having one side length of $L_{A2}$ and the second open windows are formed. In order to provide an exposed portion of the P+ type base region immediately below the N type polysilicon film 118, the following must be satisfied: $2X_{jb,l} > L_{A2} > 2X_{js,l}$, where $L_{A2}=2.0$ μm, for example. After removing this photo-resist, the gate oxide film 103 is removed by wet-etching although it is shown in FIGS. 5A to 5C for simplicity of illustration. The thickness of the silicon oxide film 106 in this stage is about 300 nm. A silicon oxide film (not shown) about 10 nm thick is formed on the N− type epitaxial layer 102, the gate electrode 104a and exposed portion of the N+ type polysilicon film 118. Since $L_{A2}$ satisfies the above inequality, the exposed portion of the P+ type base region is also formed immediately below the N+ type polysilicon film 118. Boron ion is injected under conditions of 70 keV and $5 \times 10^{13}$ cm⁻². By heat treating it at 1140° C. for 120 minutes, and P+ type base region 107a ($X_{jb}=2.5$ μm, $X_{jb,l}=2.0$ μm) is formed. Then, arsenic ion is injected under conditions of 70 keV and $1 \times 10^{16}$ cm⁻². By heat treating it at 1000° C., the N+ type source region 108 ($X_{js}=0.6$ μm, $X_{js,l}=0.5$ μm) is formed. Since $L_{A2}$ satisfies the inequality, a region containing no N+ type source region 108 is formed immediately below the N+ type polysilicon film 118, as shown in FIG. 5B.

Then, the silicon nitride film left on the N+ type polysilicon film 118 is removed by wet-etching. Then, a photo-resist 109 having openings for exposing the N+ type polysilicon film 118 is formed. The N+ type polysilicon film 118 is etched away by using this photo-resist 109 as a mask as shown in FIG. 5C. It is possible to remove the gate oxide film 103 by etching by using this photo-resist 109.

Figure 5D:
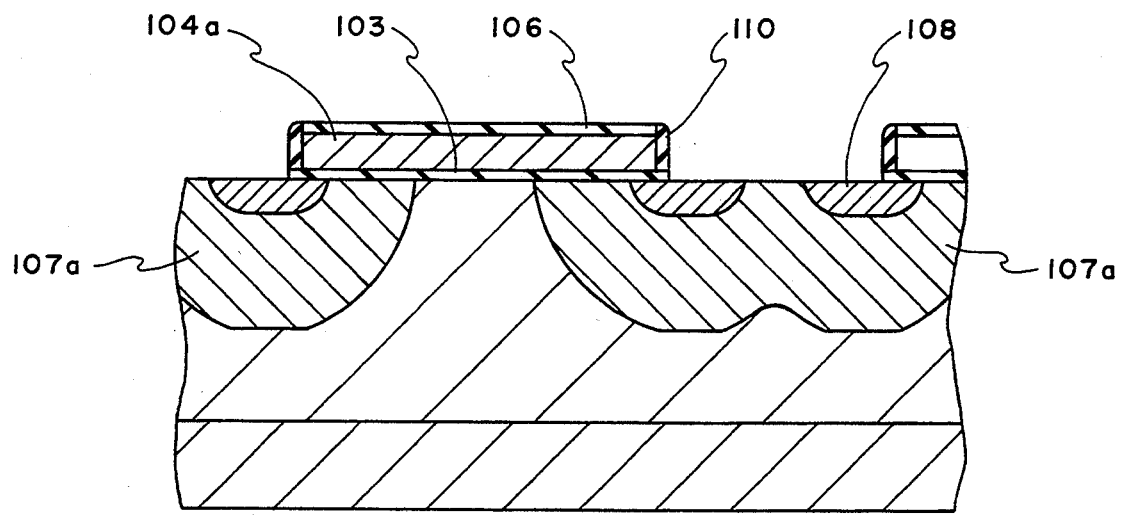

After the removal of the photo-resist 109, the gate oxide film 103 (and the N− type epitaxial layer 102, the gate electrode 104a and the silicon oxide film formed on the exposed surface of the N+ type polysilicon film 118) is removed by wet-etching, resulting in the first open windows. In this stage, the thickness of the silicon oxide film 106 is further reduced to about 200 nm. A silicon oxide film about 200 nm thick is deposited on the whole surface by CVD. The silicon oxide film is etched back, resulting in the spacer 110 having thickness of about 200 nm on the side surfaces of the gate electrode 104a, as shown in FIG. 5D. Then, a source electrode and drain electrode are formed, resulting the VDMOSFET according to this embodiment.

In the first embodiment described above, each VDMOSFET is usually formed by two first open windows 143 and one second open window 145. However, some of VDMOSFETs can be formed by one first open window 143a, although the number of such VDMOSFETs is small. In the following description, it is assumed that two virtual VDMOSFETs are formed by two first open windows 143 and one second open window 145. With such assumption, one virtual VDMOS-FET (virtual cell transistor) is formed per open window 143 and an area occupied by one first open window 143 can be defined as virtual cell size. The virtual cell size in this case is $L_L^2 = 100$ μm². With the provision of the second open window 145 in the form of slit, channel width of a virtual cell transistor is increased compared with that of a cell transistor providing the minimum value of $A_C \cdot R_{ON}$ for the above mentioned square open window by about $6 \times 2^{0.5}$ μm. Therefore, apparent channel width per 1 mm² in this embodiment becomes about 278 μm. When effective channel width per 1 mm² is calculated from the value $A_C \cdot R_{ON}$ in this embodiment, it becomes about 222 mm. From this, contribution of the apparent increase of the channel width to the increase of effective channel width is about 37%. In order to further improve this contribution, it is enough to make the minimum distance $L_b$ between two adjacent P+ type base regions (for example, a distance between two adjacent P+ type base regions 107a) as wide as possible.

Figure 6:
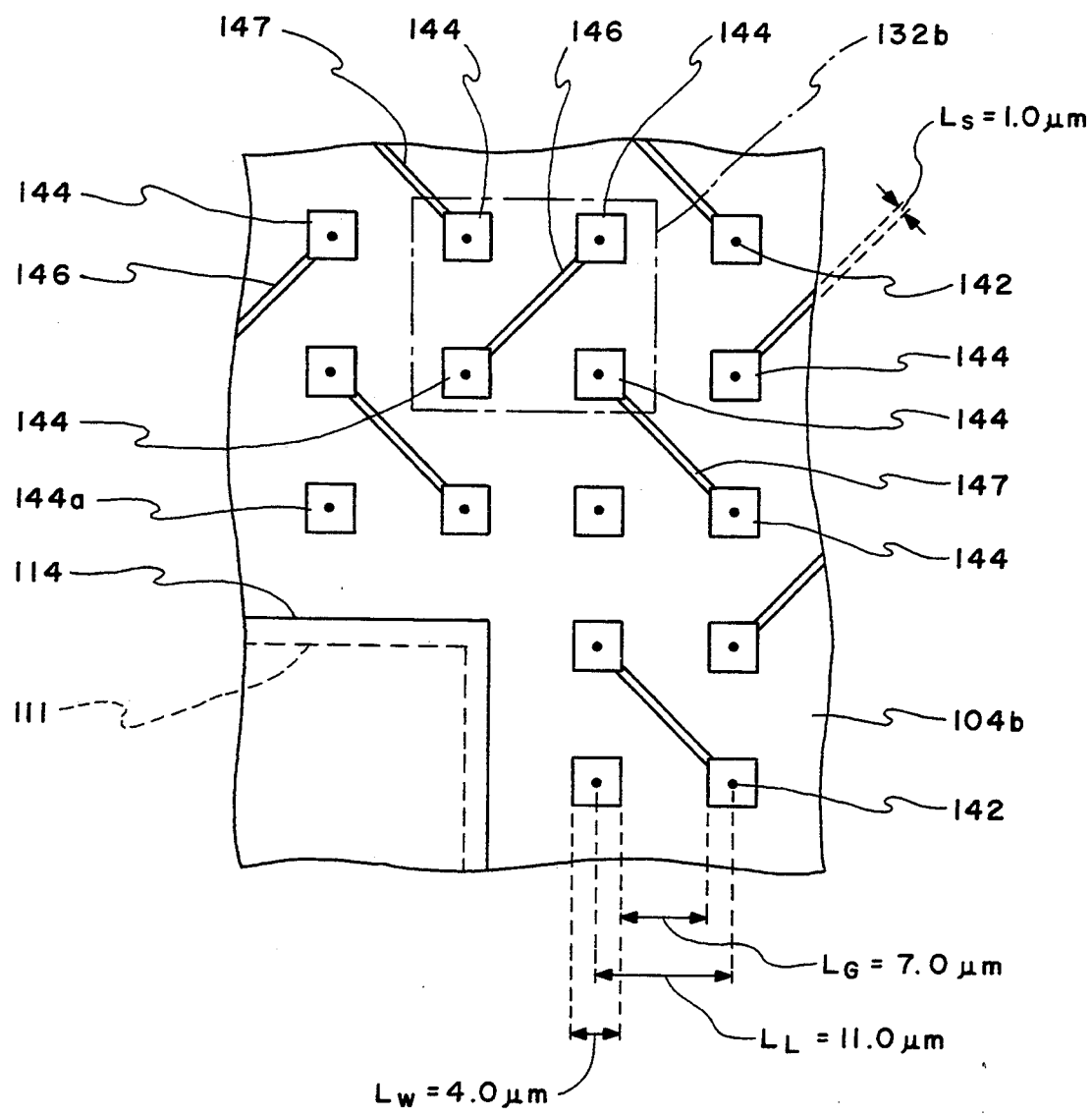
FIG. 6 is a schematic plan view of a gate electrode of a VDMOSFET according to a second embodiment of the present invention.

FIG. 6 is a schematic plan view of a gate electrode of a VDMOSFET according to a second embodiment of the present invention. In FIG. 6, a positional relation between a source electrode and gate electrode on a chip surface of the VDMOSFET is the same as that of the first embodiment and a gate bonding pad 114 is connected to a gate electrode 104b through a contact hole 111. However, a gate electrode 104b is different from that of the first embodiment. That is, the gate electrode 104b is provided with first square open windows 144 and 144a whose one side length $L_W = 4.0$ μm and second open windows 146 and 147 in the form of slits whose width $L = 1.0$ μm. Centers of the first open windows 144 and 144a are positioned at lattice points 142 of a two dimensional square lattice whose lattice constant $L_L$ is 11.0 μm. A distance $L_G$ between the two adjacent open windows 144 (144a), that is, the gate electrode length is 7.0 μm. The main difference between the embodiment and the first embodiment are that the gate electrode length $L_G$ is increased by 7 μm to make the cell size $L_L^2 = 121$ μm² and the slit width Ls of the second open windows 146, 147 is increased to 1.0 μm.

Figure 7A:
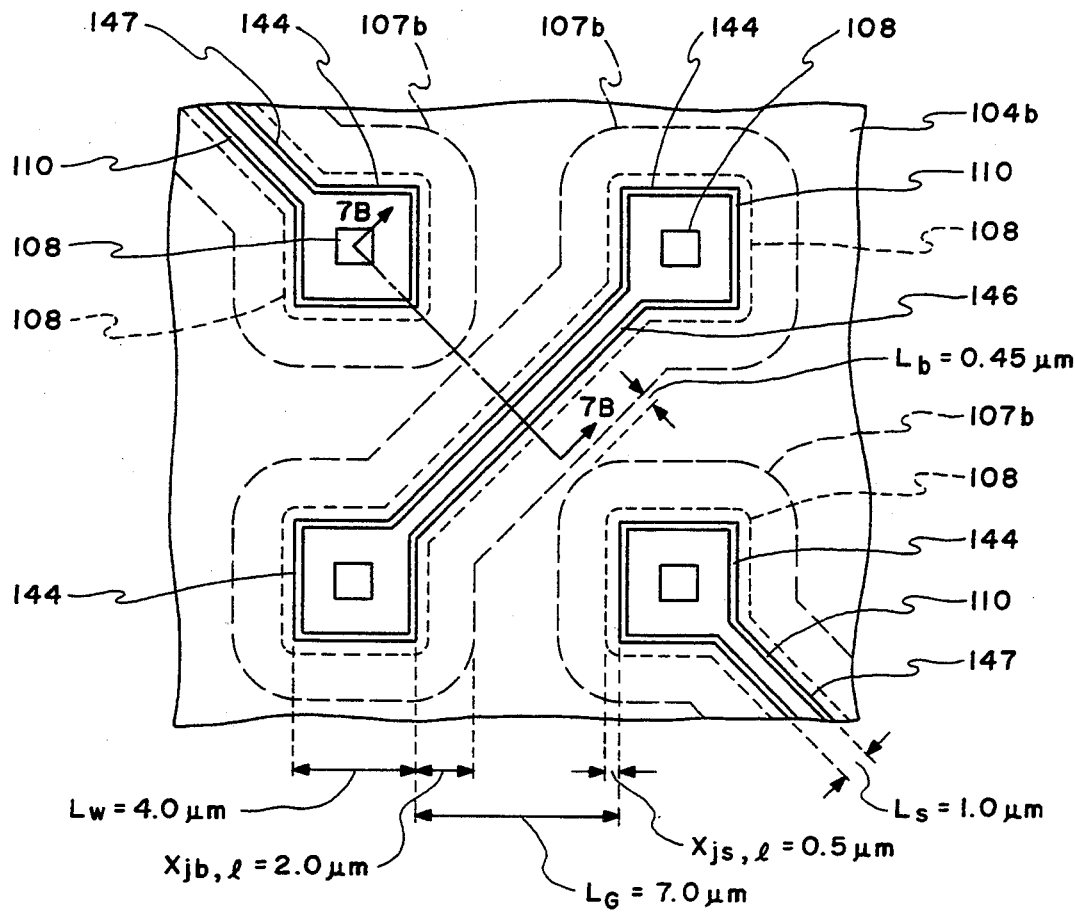
FIG. 7A is an enlarged plan view of a region 132b shown in FIG. 6, schematically showing structure below the gate electrode of the VDMOSFET according to the first embodiment.
Figure 7B:
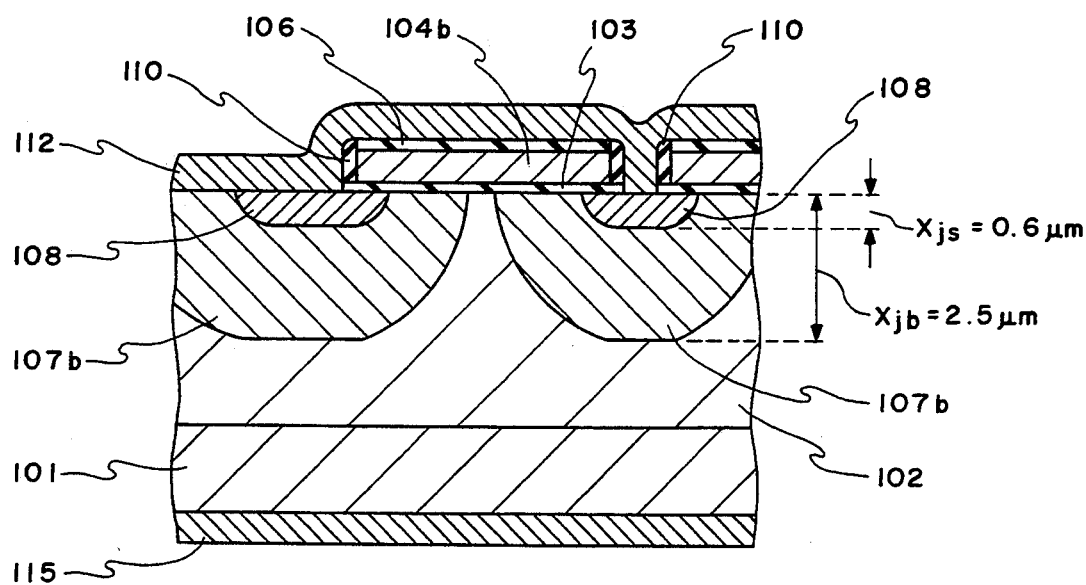
FIG. 7B is an enlarged schematic cross section taken along a line BB in FIG. 7A.

The structure of the VDMOSFET according to the second embodiment will be described with reference to FIG. 7A which is an enlarged plan view of a region 132b shown in FIG. 6, schematically showing structure below the gate electrode of the VDMOSFET according to the first embodiment and FIG. 7B which is an enlarged schematic cross section taken along a line AA in FIG. 7A.

On a surface of an N+ type silicon substrate 101, an N− type epitaxial layer 102 is formed on which a gate electrode 104b composed of a gate oxide film 103 having thickness of about 50 nm and an N+ type polysilicon film is formed. On the gate electrode 104b, the first open windows 144 (and 144a) and the second open windows 146 and 147 are formed as mentioned previously. A silicon oxide film 106 which is a first insulating film is formed on an upper surface of the gate electrode 104b and spacers 110 which is of a silicon oxide film as a second insulating film is formed on side surfaces of the gate electrode 104b (edge portions of the open windows 144, 144a, 146 and 147). Since the width $L_S$ of the second open window 146, 147 in the form of slits is 1.0 μm, the N+ type source region 108 is exposed in also the second open window.

One P+ type base region 107b is formed on a surface of an N− type epitaxial layer 102 in self-aligned manner with one of the second open windows 146 (or one second open window 147) and two first open windows 144 connected by the second open window. $X_{jb}$ of the P+ type base region 107b is about 2.5 μm and $X_{jb,l}$ is about 2.0 μm. Minimum distance $L_b$ between two adjacent P+ type base regions 107b is about 0.45 μm. A source electrode 112 composed of, for example, an Al-Si-Cl alloy film is formed covering the silicon oxide film 106 and the spacer 110. The source electrode 112 is connected directly to the N+ type source region 108 and the P+ type base region 107b through the open windows, 144, 146 and 147 as contact holes. A metal drain electrode 115 is formed on the other surface of the N+ type silicon substrate 101.

According to the second embodiment, $A_C \cdot R_{ON} \approx 0.143$ mm²·106, which is more smaller than that of the first embodiment. With increase of the gate electrode length, channel width of a virtual cell transistor is increased compared with that of the cell transistor providing minimum value of $A_C \cdot R_{ON}$ in the conventional square open window by about $7 \times 2^{0.5}$ μm. However, since the cell size in this embodiment is larger than that in the first embodiment, apparent channel width per 1 mm² in this embodiment is about 242 μm which is further shorter than that in the first embodiment. On the other hand, when effective channel width per 1 mm² is calculated from the value $A_C \cdot R_{ON}$ in this embodiment, it becomes about 228 mm. From this, contribution of the apparent increase of the channel width to the increase of effective channel width is about 76%. Such improvement of contribution is due to the increased $L_b$. Although, in this embodiment, the gate electrode length $L_G$ is 7 μm and the slit width Ls of the second open window is 0.1 μm, these values are not critical.

Figure 8:
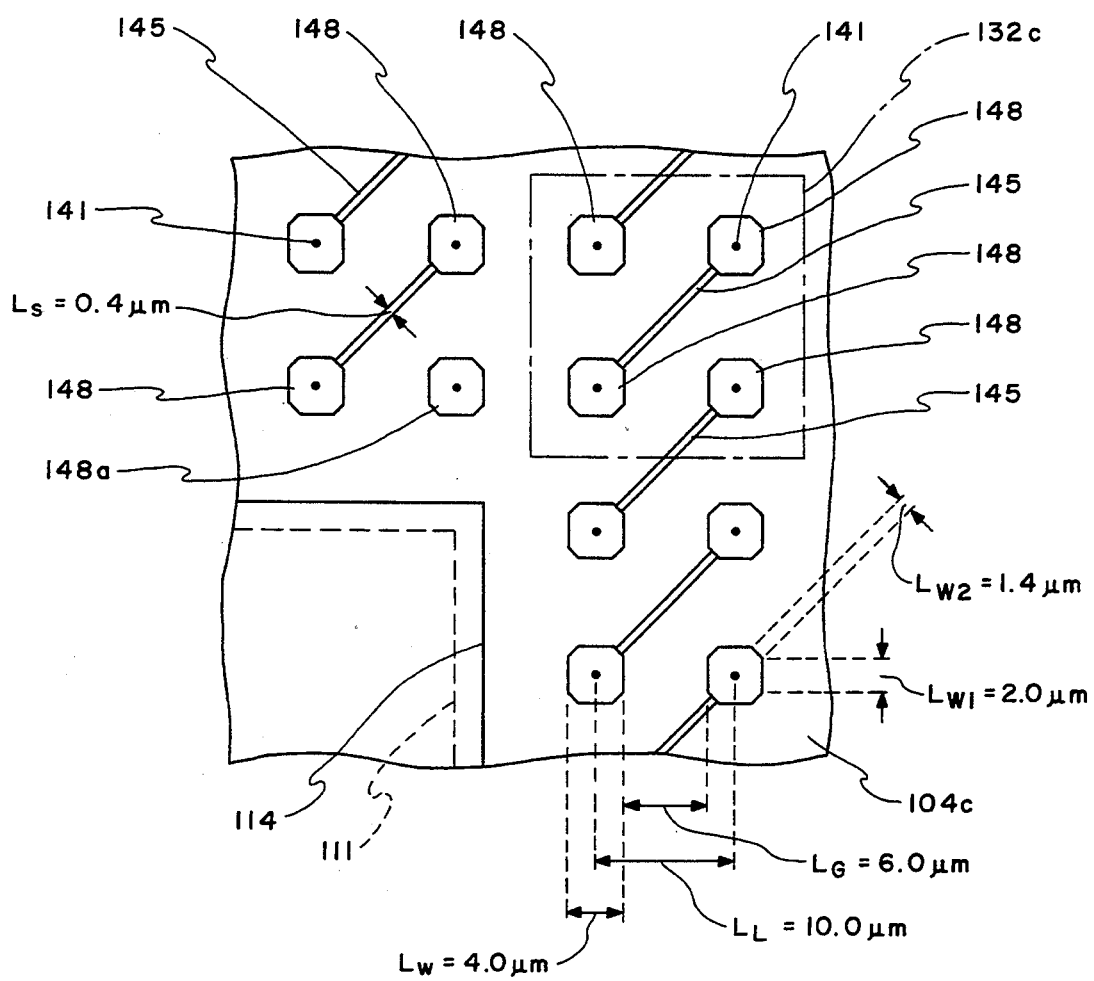
FIG. 8 is a schematic plan view of a gate electrode of a VDMOSFET according to a third embodiment of the present invention.

Referring to FIG. 8 which is a schematic plan view of a gate electrode of a VDMOSFET according to a third embodiment of the present invention, a positional relation between a source electrode and gate electrode 104c on a chip surface of the VDMOSFET is the same as that of the first embodiment and a gate bonding pad 114 is connected to a gate electrode 104c through a contact hole 111. However, a gate electrode 104c is different from that of the first embodiment. That is, the gate electrode 104c is provided with first octagonal open windows 148 and 148a each of which has two pairs of sides whose length $L_{W1} = 2.0$ μm and two pairs of sides whose length $L_{W2}$ is 1.4 μm with distance $L_W$ between the sides whose length $L_{W1}$ is 2.0 μm being 4.0 μm and second open windows 145 in the form of slit whose width $L_S$ is 0.4 μm. Centers of the first open windows 148 and 148a are positioned at lattice points 141 of a two dimensional square lattice whose lattice constant $L_L$ is 1.0 μm. A distance $L_G$ between the two adjacent open windows 148 (148a), that is, the gate electrode length is 6.0 μm. The main difference between the embodiment and the first embodiment is that the configulation of the first open windows 148, 148a are different.

Figure 9A:
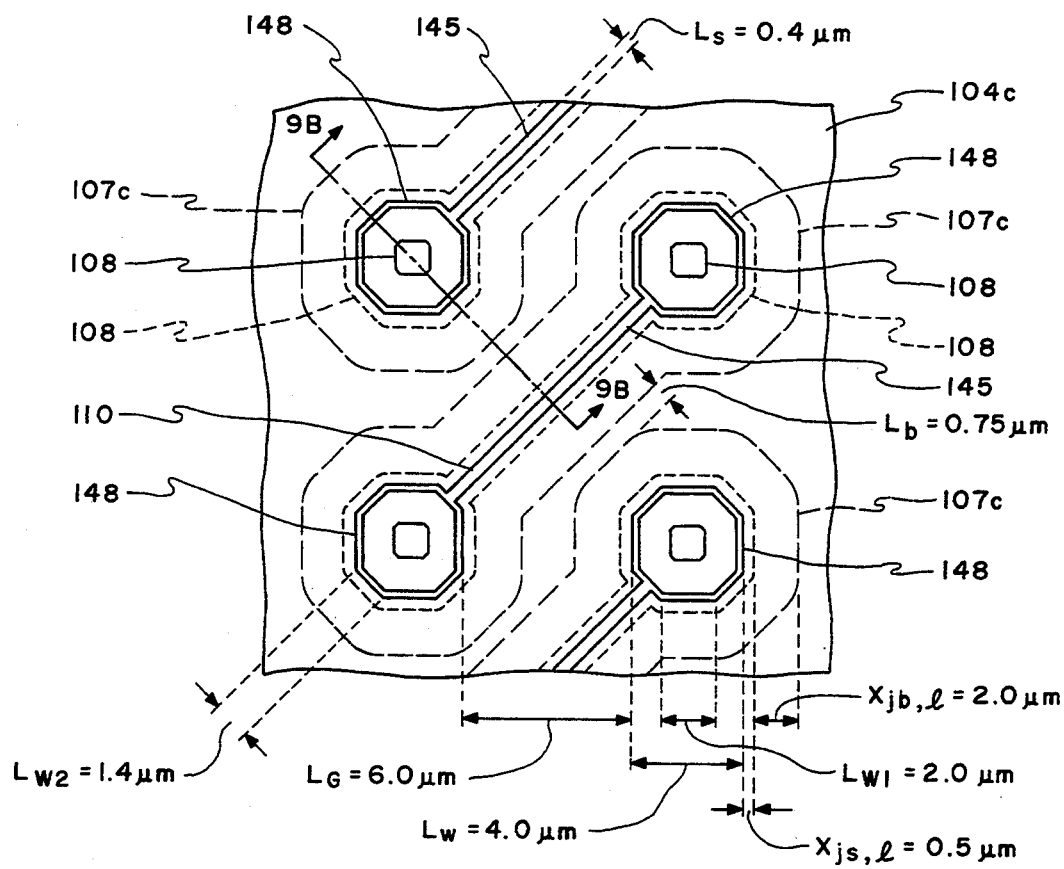
FIG. 9A is an enlarged plan view of a region 132c shown in FIG. 8, schematically showing structure below the gate electrode of the VDMOSFET according to the third embodiment.
Figure 9B:
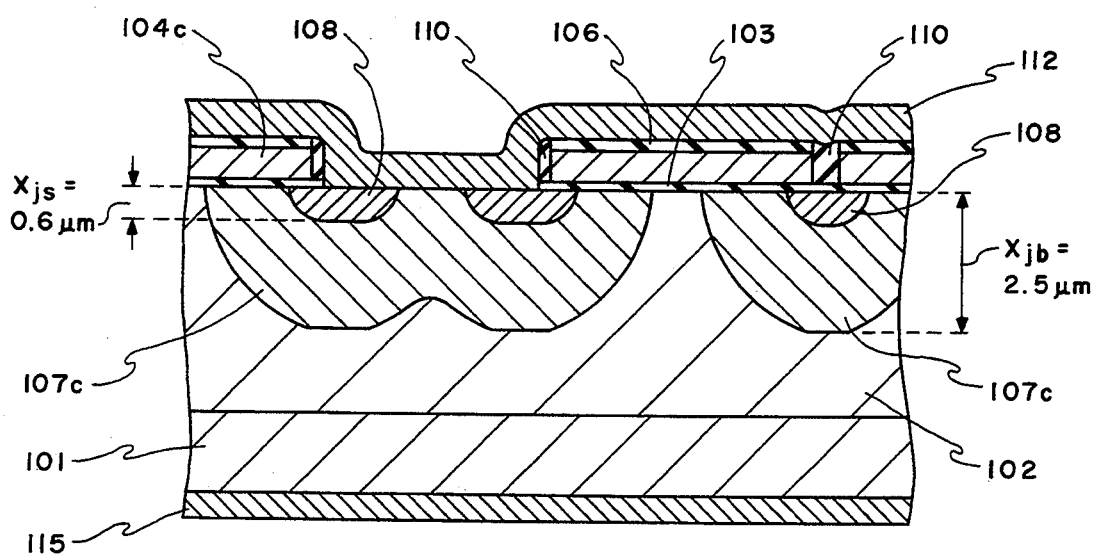
FIG. 9B is an enlarged schematic cross section taken along a line BB in FIG. 9A.

The structure of the VDMOSFET according to the third embodiment will be described with reference to FIG. 9A which is an enlarged plan view of a region 132c shown in FIG. 8, schematically showing structure below the gate electrode of the VDMOSFET according to the third embodiment and FIG. 9B which is an enlarged schematic cross section taken along a line BB in FIG. 9A.

On a surface of an N+ type silicon substrate 101, an N− type epitaxial layer 102 is formed on which a gate electrode 104c composed of a gate oxide film 103 having thickness of about 50 nm and an N+ type polysilicon film is formed. On the gate electrode 104c, the first open windows 148 (and 148a) and the second open windows 145 are formed as mentioned previously. A silicon oxide film 106 which is a first insulating film is formed on an upper surface of the gate electrode 104c and spacers 110 which is of a silicon oxide film as a second insulating film is formed on side surfaces of the gate electrode 104c (edge portions of the open windows 148, 148a and 145). Since the width $L_S$ of the second open window 145 in the form of slits is 0.4 μm, it is buried by the spacer 110 as in the first embodiment.

One P+ type base region 107c is formed on a surface of an N− type epitaxial layer 102 in self-aligned manner with one of the second open windows 145 and two first open windows 148 connected by the second open window. $X_{jb}$ of the P+ type base region 107c is 2.5 μm and $X_{jb,1}$ is about 2.0 μm. Minimum distance $L_b$ between two adjacent P+ type base regions 107b is about 0.75 μm. $X_{js}$ and $X_{js,1}$ of the N+ type source region 108 are 0.6 μm and about 0.5 μm, respectively. A source electrode 112 composed of, for example, an Al-Si-Cl alloy film is formed covering the silicon oxide film 106 and the spacer 110. The source electrode 1112 is connected directly to the N+ type source region 108 and the P+ type base region 107c through the first open windows 148 (and 148a) as contact holes. A metal drain electrode 115 is formed on the other surface of the N+ type silicon substrate 101.

According to the third embodiment, $A_C \cdot R_{ON} = 0.127$ mm²·Ω, which is smaller than that of the second embodiment. This is because the cell size in the third embodiment is smaller than that of the second embodiment and $L_b$ is larger than that of the second embodiment. Apparent channel width per 1 mm² in this embodiment is about 268 μm and effective channel width per 1 mm² is about 257 mm. From this, contribution of the apparent increase of the channel width to the increase of effective channel width is about 86%. Comparing the case where the open windows of the gate electrode is square with the case where those are octagonal, $A_C \cdot R_{ON}$ in the former case is smaller. This is related to the width of channel per virtual cell transistor. In the later case, the distance between base regions of two cell transistors obliquely adjacent to each other is larger. For this reason, $L_b$ of this embodiment is larger than $L_b$ of the other embodiments.

Although the third embodiment uses octagonal first open windows, the present invention is also applicable for, for example, any 4 m angular open windows where m is an integer larger than 1, so long as centers of such polygonal open windows can be located at lattice points of a two dimensional square lattice provided in the first direction and the second direction perpendicular to the first direction with a desired lattice interval and each polygonal open window has one pair of sides which are in parallel to the first direction and one pair of sides which are in parallel to the second direction.

Figure 10:
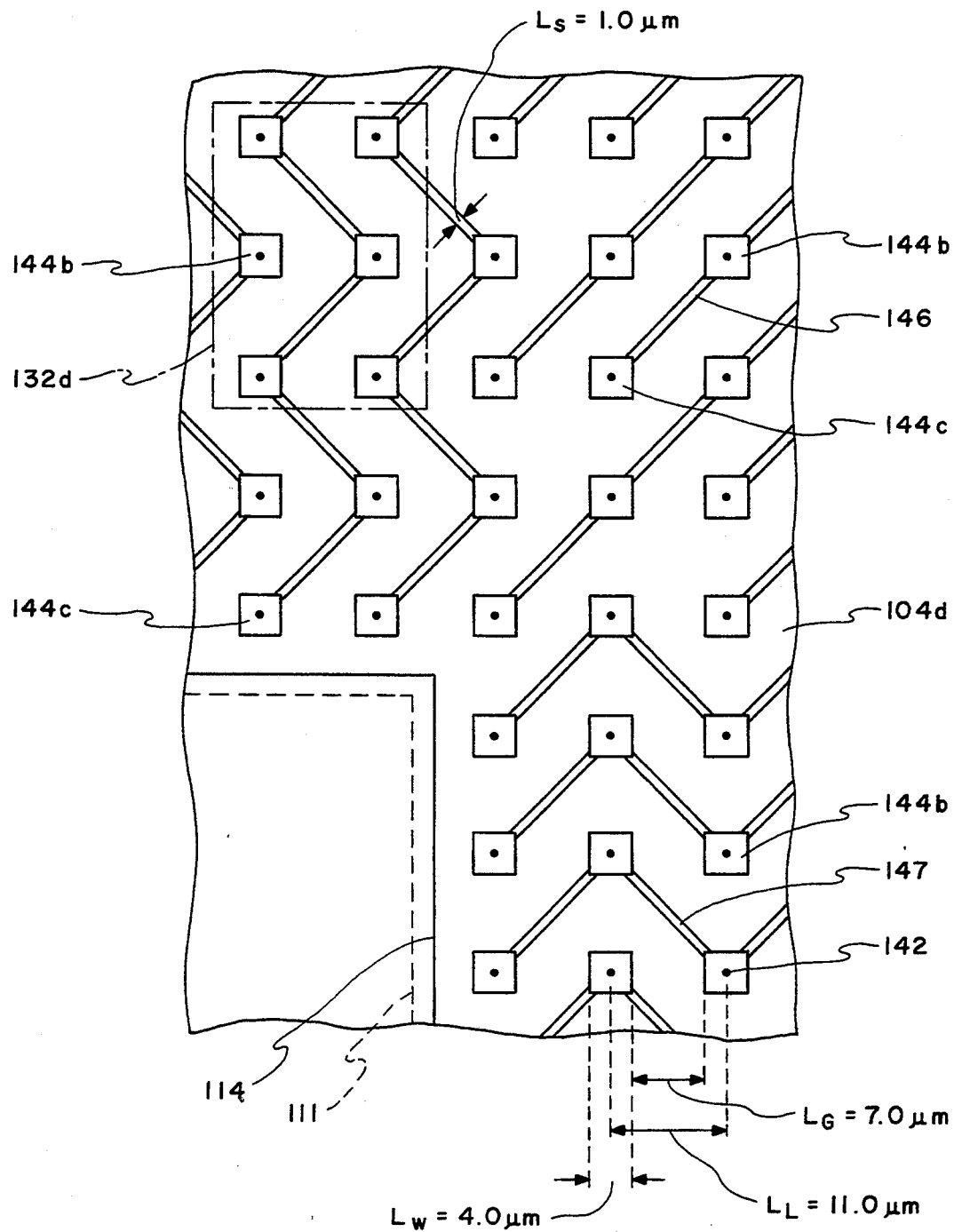
FIG. 10 is a schematic plan view of a gate electrode of a VDMOSFET according to a fourth embodiment of the present invention.

Referring to FIG. 10 which is a schematic plan view of a gate electrode of a VDMOSFET according to a fourth embodiment of the present invention, a positional relation between a source electrode and gate electrode 104d on a chip surface of the VDMOSFET is the same as that of the second embodiment and a gate bonding pad 114 is connected to a gate electrode 104c through a contact hole 111. However, a gate electrode 104d is different from that of the second embodiment. That is, the gate electrode 104d is provided with first square open windows 144b and 144c each side length length $L_W = 4.0$ μm and second open windows 146 and 147 in the form of slits whose width $L_S$ is 1.0 μm as in the second embodiment. Centers of the first open windows 144b and 144c are positioned at lattice points 142 of a two dimensional square lattice whose lattice constant $L_L$ is 11.0 μm as in the second embodiment. A distance $L_G$ between the two adjacent open windows 144b (144c), that is, the gate electrode length is 7.0 μm. The main difference between the fourth embodiment and the second embodiment is that one of the first open windows 144b is connected to two of the second open windows. The two second open windows are two of the open windows 146, two open windows 147 or a combination of one open window 146 and one open window 147. The first open window 144c is connected to one of the second open window 146 and the second open window 147. The first open window 144c is connected to only the second open window 146 or 147.

The structure of the VDMOSFET according to the fourth embodiment will be described with reference to FIG. 11A which is an enlarged plan view of a region 132d shown in FIG. 10, schematically showing structure below the gate electrode of the VDMOSFET and FIG. 11B which is an enlarged schematic cross section taken along a line AA in FIG. 11A.

On a surface of an N+ type silicon substrate 101, an N− type epitaxial layer 102 is formed on which a gate electrode 104d composed of a gate oxide film 103 having thickness of about 50 nm and an N+ type polysilicon film is formed. On the gate electrode 104d, the first open windows 144b (and 144c) and the second open windows 146 and 147 are formed as mentioned previously. A silicon oxide film 106 which is a first insulating film is formed on an upper surface of the gate electrode 104d and spacers 110 which is of a silicon oxide film as a second insulating film is formed on side surfaces of the gate electrode 104d (edge portions of the open windows 144b, 144c, 146 and 147). Since the width $L_S$ of the second open window 146, 147 in the form of slits is 1.0 μm, and N+ type source region 108 is exposed in the second open window as in the case of the second embodiment.

One P+ type base region 107d is formed on a surface of an N− type epitaxial layer 102 in self-aligned manner with a plurality of open windows formed by a plurality of the first open windows and a plurality of the second open windows alternatively connected to the first open windows. $X_{jb}$ of the P+ type base region 107d is 2.5 μm and $X_{jb,1}$ is about 2.0 μm. Minimum distance $L_b$ between two adjacent P+ type base regions 107d is about 0.45 μm. $X_{js}$ and $X_{js,1}$ of the N+ type source region 108 are 0.6 μm and about 0.45 μm, respectively. A second feature of this embodiment over the second embodiment is that base deriving electrodes 124a of P+ type polysilicon film about 475 nm thick are provided around centers of the first open windows 144b and 144c. The base deriving electrode 124a has a spacer 110 on a side surface thereof and connected to the P+ type base region 107d directly through a direct contact hole 121 provided in the gate oxide film 103. A source electrode 112 composed of, for example, an Al-Si-Cl alloy film is formed covering the silicon oxide film 106 and the spacer 110. The source electrode 112 is connected directly to the base deriving electrode 124a and to the N+ type source region 108 through the open windows 144b, 144c, 146 and 147 as contact holes. A metal drain electrode 115 is formed on the other surface of the N type silicon substrate 101.

According to the fourth embodiment, $A_C \cdot R_{ON} \approx 0.109$ mm$^2 \cdot \Omega$, which is smaller than that of the third embodiment. As one of specific effect of this embodiment with respect to the other embodiments, a contact resistance of the source electrode to the base region is reduced. This is because a contact area between the base deriving electrode and the base electrode is increased compared with the other embodiments due to the provision of the base deriving electrode. Thus, in this embodiment, the floating phenomenon of the P+ type base region due to the contact resistance is easily restricted to thereby reduce the parasitic NPN transistor effect. Therefore, this embodiment is particularly effective to accommodate increased contact resistance caused by miniaturization of element. The base deriving electrode in this embodiment can be also applied to any of the first, second and third embodiments.

Figure 11A:
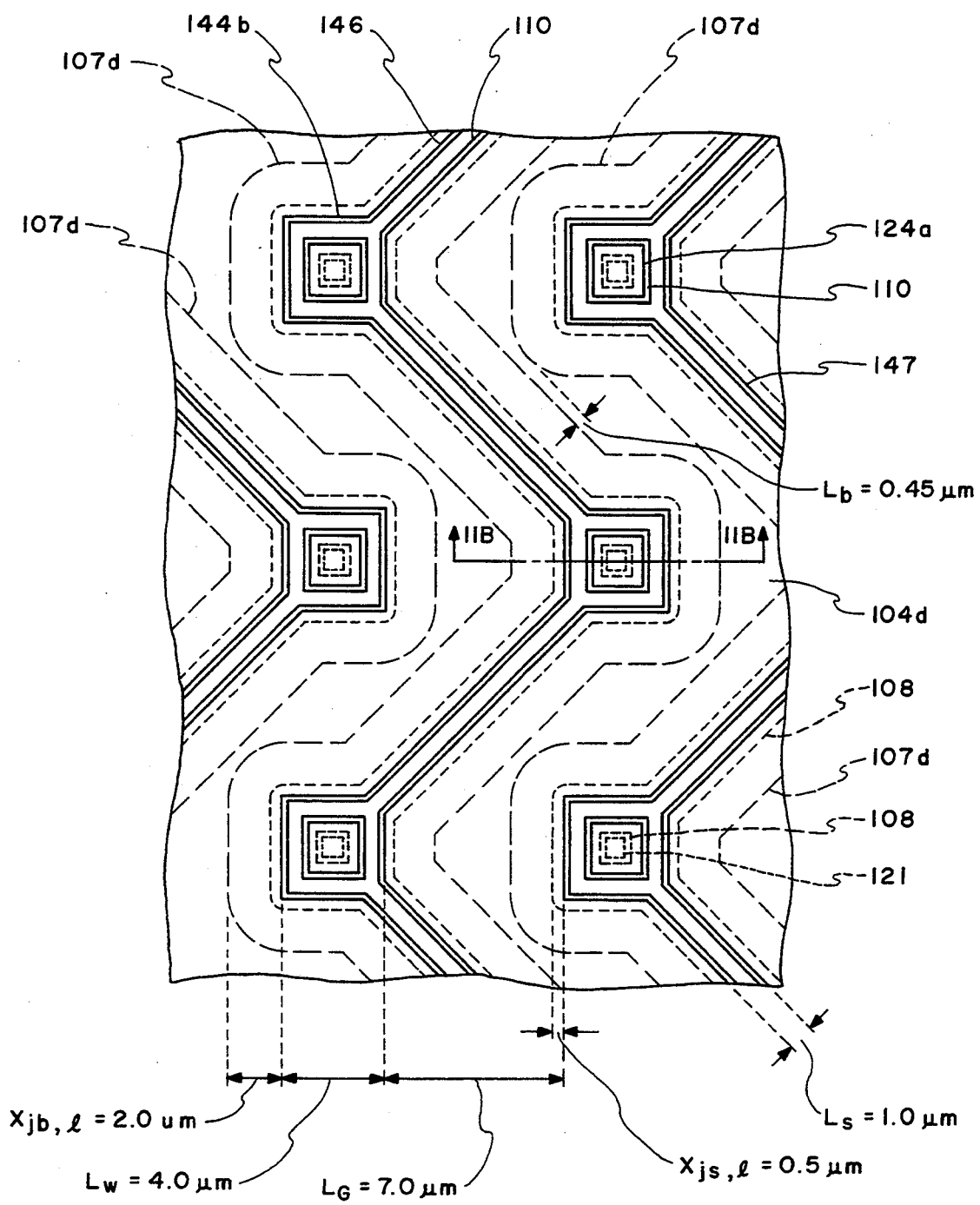
FIG. 11A is an enlarged plan view of a region 132d shown in FIG. 10, schematically showing structure below the gate electrode of the VDMOSFET according to the fourth embodiment.
Figure 11B:
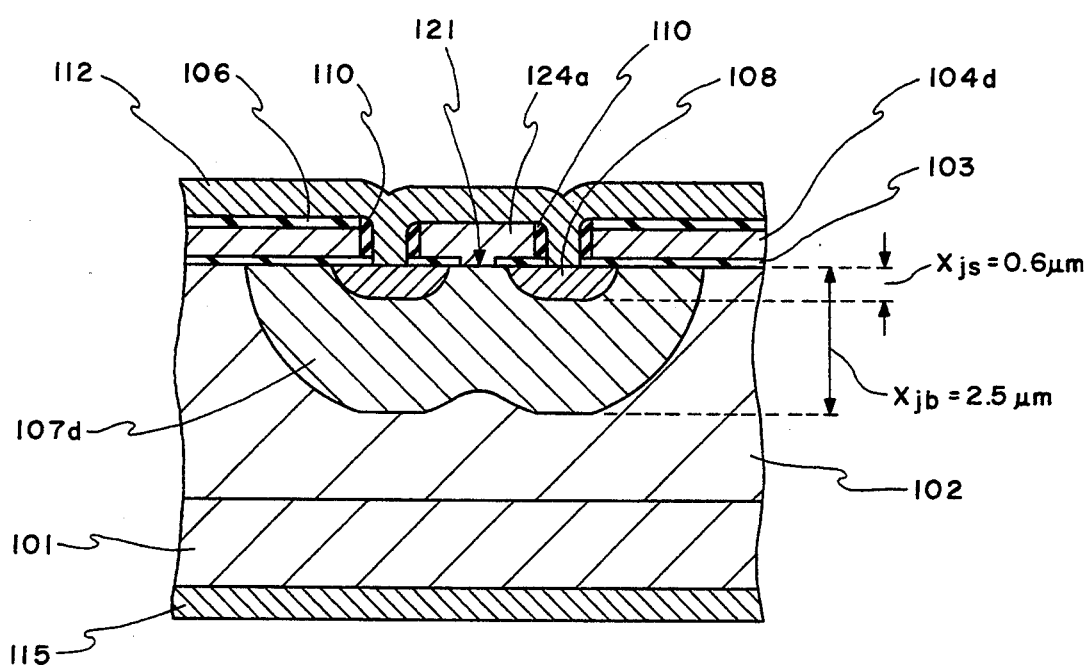
FIG. 11B is an enlarged schematic cross section taken along a line AA in FIG. 11A.

The VDMOSFET according to the fourth embodiment can be manufactured as shown in FIGS. 12A to 12D which are enlarged cross sections taken along the AA line in FIG. 11A in various steps. The method used in this embodiment is the 0.4 μm process as in the first embodiment wherein the minimum machining size is 0.4 μm and alignment preciseness is ±0.05 μm.

Figure 12A:
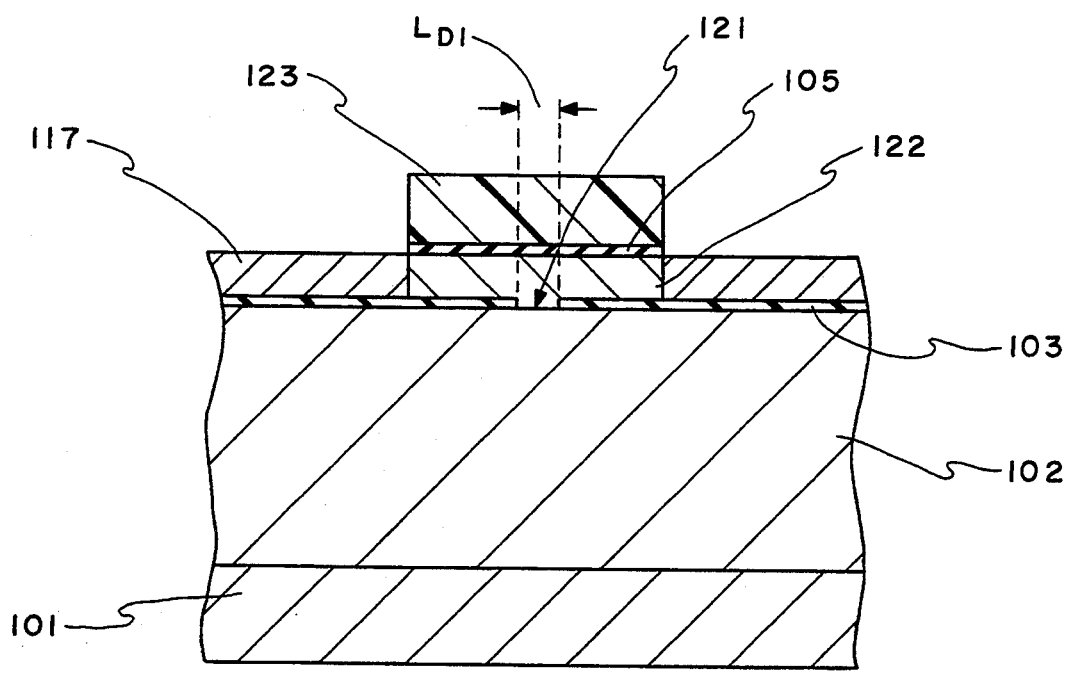
FIG. 12A to 12D are enlarged cross sections taken along a line AA in FIG. 11A, showing manufacturing steps thereof.

First, the N− type epitaxial layer 102 is formed on the surface of the N+ type silicon substrate 101. The gate oxide film 103 is formed on the N− type epitaxial layer 102 by thermal oxidation. A direct contact hole 121 of a regular shape having one side whose length $L_{D1}$ of which is, for example, 0.6 μm is formed at a portion of the gate oxide film 103 which is to become a center of the first open window. On the gate oxide film 103, a non-doped polysilicon film 122 having thickness of about 650 nm is formed by CVD. A silicon nitride film 105 having a predetermined thickness is formed on the non-doped polysilicon film 122 by CVD. The silicon nitride film 105 is etched away by using a photo-resist film 123 except portions thereof in which first and second open windows are to be formed. Then, arsenic ion is injected through the photo-resist film 123 as a mask to convert the non-doped polysilicon film 122 in the portion the silicon nitride film 105 on which is removed into an N+ type polysilicon film 117 (FIG. 12A).

Figure 12B:
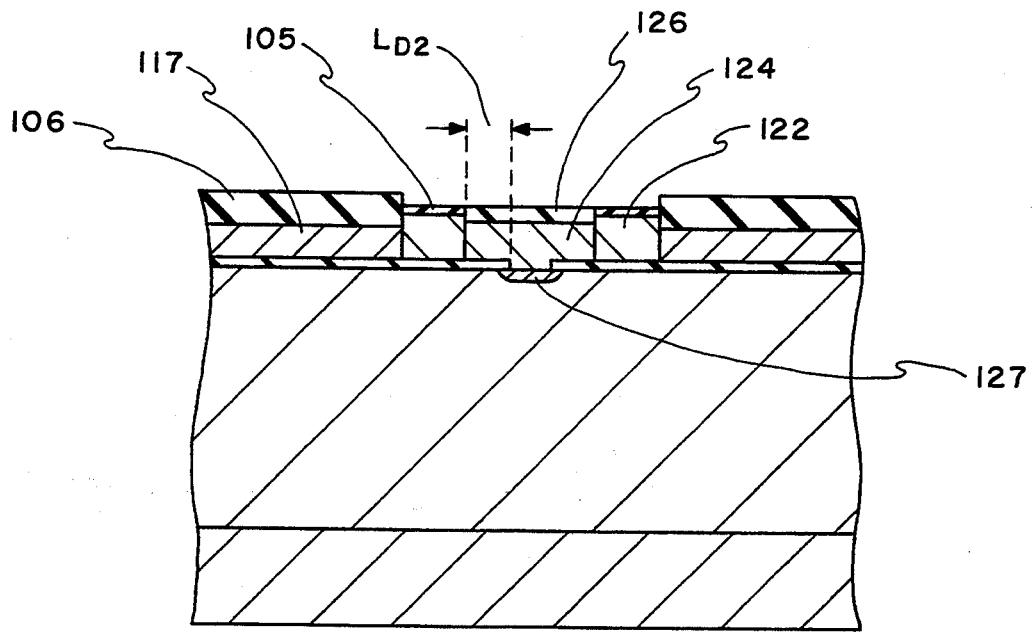

Then, a photo-resist film (not shown) is formed on the wafer and, by using this photo-resist film as a mask, the silicon nitride film 105 on a region in which the base deriving electrode is to be formed is etched away. A distance between the residual silicon nitride film 105 and the direct contact hole in this case is represented by $L_{D2}$ which is larger than $X_{js,1}$ and, for example, 0.7 μm since it is preferably that the N+ type source region should not reach a portion immediately below the direct contact hole 121. The P+ type polysilicon film 124 is formed by injecting boron using this photo-resist film as a mask. The boron injection is performed under condition of, for example, 100 keV, $2 \times 10^{15}$ cm$^{-2}$. After the latter photo-resist film is removed, thermal oxidation is performed by using steam at 950° C. to form a silicon oxide film 106 having thickness of about 500 nm and a silicon oxide film 126 having thickness of about 250 nm on the N+ type polysilicon film 117 and the P+ type polysilicon film 124, respectively. By this thermal oxidation, a P+ type diffusion region having junction depth sufficiently smaller than that $X_{jb}$ of the P+ type base region is formed on the N− type epitaxial layer 102 in self-aligned manner with the direct contact hole 121. Further, with this thermal oxidation, the thickness of the N+ type polysilicon film 117 and the P+ type polysilicon film 124 becomes about 400 nm and about 475 nm, respectively (FIG. 12B).

Figure 12C:
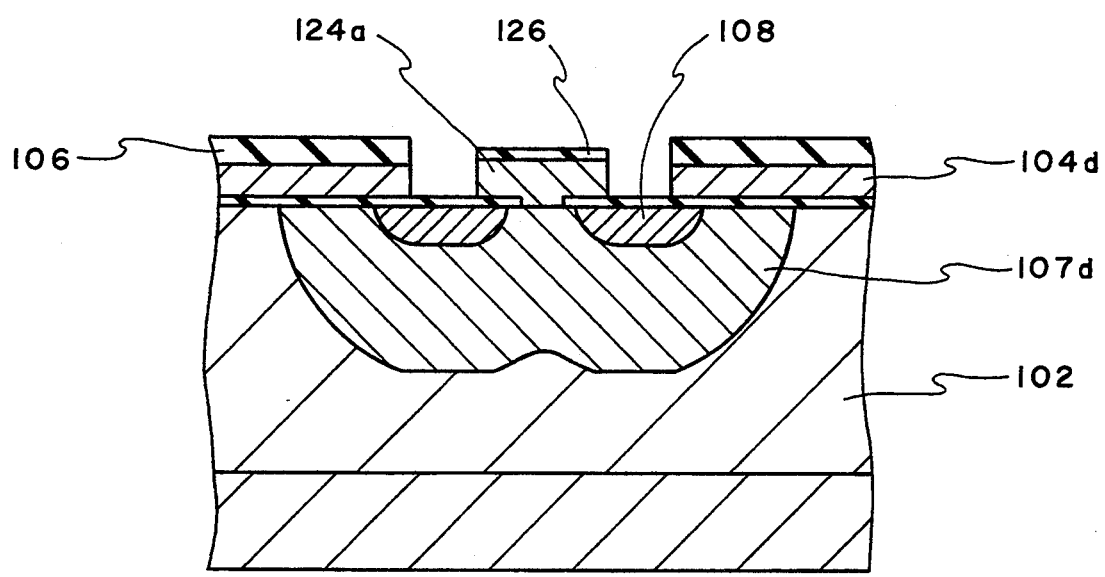

Then, the silicon nitride film is removed by wet-etching. Then, the non-doped polysilicon film 122 is preferentially removed by anisotropic etching with HBr, etc., using the silicon oxide films 105 and 124 as masks. In this stage, the N+ type polysilicon film 117 and the P+ type polysilicon film 124 become the gate electrode 107d and the base deriving electrode 124a, respectively. Although not shown, the gate oxide film 103 on the portion exposed by the wet-etching is thereafter removed in the same manner as in the first embodiment. A silicon oxide film about 10 nm thick is formed on the exposed N− type epitaxial layer 102, the gate electrode 107d and the base deriving electrode 124a by thermal oxidation. In this stage, the thickness of the silicon oxide films 105 and 124 become 400 nm and 150 nm, respectively. Then, as in the first embodiment, the P+ type base region 107d is formed on the N− type epitaxial layer 102 and then the N+ type source region 108 is formed on the P+ type base region 107d. The P+ type diffusion region is absorbed by the P+ type base region 107d (FIG. 12C).

Figure 12D:
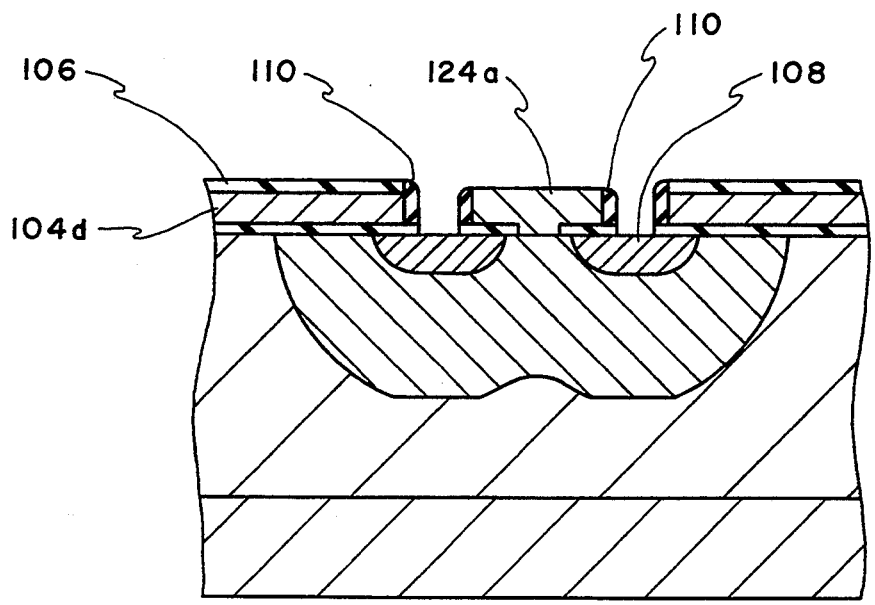

Then, the silicon oxide film 126 is removed. A photo-resist film may be used for this purpose. If the use of photo-resist is not suitable, the whole surface is wet-etched. In this stage, the thickness of the silicon oxide film 106 becomes about 200 nm. Further, in this stage, in oder to correct the side-etching of the gate oxide film 103 immediately below the electrodes 107d and 124a, a silicon oxide film about 25 nm thick is formed again on the exposed N− type epitaxial layer 102, the gate electrode 107d and the base deriving electrode 124a by thermal oxidation. Then, a silicon oxide film about 200 nm thick is deposited on the whole surface by CVD. The latter silicon oxide film is etched back, resulting in the spacers 110 on the side surfaces of the gate electrode 107d and the base deriving electrode 124a, as shown in FIG. 12D. Then, a source electrode and drain electrode are formed in the same manner as used in the first embodiment, resulting the VDMOSFET shown in FIGS. 10, 11A and 11B.

Although the present invention has been described with reference to specific embodiments, this description is not meant to be construed in a limiting sense. Various modifications of the disclosed embodiments, as well as other embodiments of the present invention, will become apparent to the persons skilled in the art upon reference to the description of the present invention. It is therefore contemplated that the appended claims will cover any modifications or embodiments as fall within the true scope of the present invention.

What is claimed is:

1. A vertical double diffused MOSFET comprising:
   a silicon substrate of one conductivity type;
   an epitaxial layer of the one conductivity type, said epitaxial layer being formed on one surface of said silicon substrate and having a predetermined thickness;
   a gate oxide film formed on a surface of said epitaxial layer;
   a gate electrode formed on said gate oxide film, said gate electrode being formed with a plurality of first open windows having a predetermined polygonal shape and centered at lattice points of a square lattice arranged in a first direction and in a second direction orthogonal to the first direction with a predetermined interval and a second open window in the form of a slit having a predetermined width, and arranged on a line connecting the center of one of said first open windows to the center of at least one of four other first open windows obliquely adjacent to said one first open window;

a first insulating film provided on an upper surface of said gate electrode;

a second insulating film provided on side surfaces of said gate electrode;

a base region of the other conductivity type having a predetermined junction depth and formed on the surface of said epitaxial layer in a self-aligned manner to said second open window and said first open windows which connect to said second open window;

a source region of the one conductivity type having a junction depth smaller than the junction depth of said base region and formed on a surface of said base region with one edge thereof being self-aligned with said second open window and said first open windows which connect to said second open window and the other edge being formed in said one first open window and being spaced from the edge of said one first open window by a predetermined width;

a source electrode covering said first and second insulating films and being short-circuited to said base region in said one first open window and directly connected to said source region; and a drain electrode formed on the other surface of said silicon substrate.

2. A vertical double diffused MOSFET comprising:

a silicon substrate of one conductivity type;

an epitaxial layer of the one conductivity type, said epitaxial layer being formed on one surface of said silicon substrate and having a predetermined thickness;

a gate oxide film formed on a surface of said epitaxial layer;

a gate electrode formed on said gate oxide film, said gate electrode being formed with a plurality of first open windows having a predetermined polygonal shape and centered at lattice points of a square lattice arranged in a first direction and in a second direction orthogonal to the first direction with a predetermined interval and two second open windows, each of the two second open windows being in the form of a slit having a predetermined width, at least one of said first open windows being connected to two of said first open windows obliquely adjacent to said at least one first open window by said two second open windows;

a first insulating film provided on an upper surface of said gate electrode;

a second insulating film provided on side surfaces of said gate electrode;

a base region of the other conductivity type having a predetermined junction depth and formed on the surface of said epitaxial layer in a self-aligned manner to said two second open windows and said first open windows which connect to said two second open windows;

a source region of the one conductivity type having a junction depth smaller than the junction depth of said base region and formed on a surface of said base region with one edge thereof being self-aligned with said two second open windows and said first open windows which connect to said two second open windows and the other edge being formed in said at least one first open window and being spaced from the edge of said at least one first open window by a predetermined width;

a source electrode covering said first and second insulating films and being short-circuited to said base region in said at least one first open window and directly connected to said source region; and a drain electrode formed on the other surface of said silicon substrate.

3. The vertical double diffused MOSFET claimed in one of claims 2 or 1, wherein each said polygonal first open window has two sides parallel to said first direction and two sides parallel to said second direction.

4. The vertical double diffused MOSFET claimed in claim 3, wherein each said first open window is square.

5. The vertical double diffused MOSFET claimed in claim 3, wherein each said first open window is octagonal.

6. The vertical double diffused MOSFET claimed in claim 1 wherein said source electrode is directly connected to said source region in said second open window.

7. The vertical double diffused MOSFET claimed in claim 2 wherein said source electrode is directly connected to said source region in said two second open windows.

* * * * *